(12) United States Patent
Cobb et al.

(10) Patent No.: US 7,741,557 B2
(45) Date of Patent: Jun. 22, 2010

(54) APPARATUS FOR OBTAINING RADIANT ENERGY

(75) Inventors: Joshua Monroe Cobb, Victor, NY (US); John H Bruning, Pittsford, NY (US)

(73) Assignee: Corning Incorporated, Corning, NY (US)

(*) Notice: Subject to any disclaimer, the term of this patent is extended or adjusted under 35 U.S.C. 154(b) by 541 days.

(21) Appl. No.: 11/498,673

(22) Filed: Aug. 3, 2006

(65) Prior Publication Data

US 2007/0107769 A1   May 17, 2007

Related U.S. Application Data

(60) Provisional application No. 60/751,810, filed on Dec. 19, 2005, provisional application No. 60/778,080, filed on Feb. 28, 2006.

(51) Int. Cl.
*H01L 31/042* (2006.01)
*H02N 6/00* (2006.01)
*G02B 27/14* (2006.01)

(52) U.S. Cl. ...................... 136/246; 359/633
(58) Field of Classification Search ........... None
See application file for complete search history.

(56) References Cited

U.S. PATENT DOCUMENTS

| | | | |
|---|---|---|---|
| 3,922,069 A * | 11/1975 | Kishikawa et al. .......... 359/633 |
| 4,021,267 A * | 5/1977 | Dettling ..................... 136/246 |
| 4,204,881 A | 5/1980 | McGrew | |
| 4,700,013 A | 10/1987 | Soule ......................... 136/248 |
| 4,806,750 A * | 2/1989 | Vincent ...................... 250/226 |
| 5,005,958 A | 4/1991 | Winston et al. ............. 350/442 |
| 5,902,417 A | 5/1999 | Lillington et al. | |
| 5,979,438 A | 11/1999 | Nakamura ................... 126/680 |
| 6,441,957 B1 * | 8/2002 | Teuchert et al. ............. 359/364 |
| 6,835,888 B2 | 12/2004 | Sano et al. ................... 136/249 |

* cited by examiner

*Primary Examiner*—Kaj K Olsen
*Assistant Examiner*—Kourtney R Salzman
(74) *Attorney, Agent, or Firm*—Timothy M. Schaeberle

(57) ABSTRACT

An apparatus for obtaining energy from a polychromatic radiant energy source has a light concentrator for concentrating and redirecting incident radiant energy, having an optical axis, and a spectral separator disposed along the optical axis, apart from the light concentrator and in the path of concentrated, redirected radiant energy. The spectral separator has a first planar surface treated to reflect a first spectral band of light toward a first focal region and to transmit a second spectral band and a second planar surface spaced apart from the first planar surface and oblique with respect to the first planar surface. The second planar surface is treated to reflect the second spectral band back through the first planar surface and toward a second focal region spaced apart from the first focal region. First and second light receivers are disposed nearest each respective focal region for receiving the first and second spectral bands.

35 Claims, 24 Drawing Sheets

APPARATUS FOR OBTAINING RADIANT ENERGY

CROSS REFERENCE TO RELATED APPLICATIONS

Reference is made to U.S. Provisional Patent Application Ser. No. 60/751,810 entitled "Method and Apparatus for Concentrating Light" by Cobb et al. filed Dec. 19, 2005. Reference is also made to U.S. Provisional Patent Application Ser. No. 60/778,080 entitled "Light Collector and Concentrator" by Cobb et al. filed Feb. 28, 2006.

STATEMENT REGARDING FEDERALLY SPONSORED RESEARCH OR DEVELOPMENT

This invention was made with government support under agreement w911nf-05-9-0005 awarded by the government. The government has certain rights in the invention.

FIELD OF THE INVENTION

This invention generally relates to apparatus for efficiently collecting and concentrating light, and more particularly relates to an apparatus that collects and separates light into two or more spectral bands, each directed toward a separate receiver.

BACKGROUND OF THE INVENTION

Efficient collection and concentration of radiant energy is useful in a number of applications and is of particular value for devices that convert solar energy to electrical energy. Concentrator solar cells make it possible to obtain a significant amount of the sun's energy and concentrate that energy as heat or for generation of direct current from a photovoltaic receiver.

Large-scale light concentrators for obtaining solar energy typically include a set of opposed, curved mirrors with a Cassegrain arrangement as an optical system for concentrating light onto a receiver that is positioned at a focal point. As just a few examples employing the Cassegrain model, U.S. Pat. No. 5,979,438 entitled "Sunlight Collecting System" to Nakamura and U.S. Pat. No. 5,005,958 entitled "High Flux Solar Energy Transformation" to Winston et al. both describe large-scale solar energy systems using sets of opposed primary and secondary mirrors. As a more recent development for providing more compact collection apparatus, planar concentrators have been introduced, such as that described in the article entitled "Planar Concentrators Near the Etendue Limit" by Roland Winston and Jeffrey M. Gordon in *Optics Letters*, Vol. 30 no. 19, pp. 2617-2619. Planar concentrators similarly employ primary and secondary curved mirrors with a Cassegrain arrangement, separated by a dielectric optical material, for providing high light flux concentration.

FIG. 1A shows the basic Cassegrain arrangement for light collection. A photovoltaic apparatus 10 with an optical axis O has a parabolic primary mirror 12 and a secondary mirror 14 located near the focal point of primary mirror 12. A receiver 16 is then placed at the focal point of this optical system, at the vertex of primary mirror 12. A recognized problem with this architecture, a problem inherent to the Cassegrain model, is that secondary mirror 14 presents an obstruction to on-axis light, so that a portion of the light, nominally as much as about 10%, does not reach primary mirror 12, reducing the overall light-gathering capability of photovoltaic apparatus 10. This obscuration can be especially large if the concentrator is cylindrical instead of rotationally symmetric. Placement of receiver 16 at the vertex of primary mirror 12, in the path of the obstruction presented by secondary mirror 14, helps somewhat to mitigate losses caused by the obstruction. However, with a cylindrical optical configuration, little or none of this obstruction loss is gained back by making dimensional adjustments, since the size of the obstruction scales upwards proportionally with any increased size in primary mirror 12 diameter. This means that enlarging the diameter of the larger mirror does not appreciably change the inherent loss caused by the obstruction from the smaller mirror.

Some types of solar energy systems operate by converting light energy to heat. In various types of flat plate collectors and solar concentrators, concentrated sunlight heats a fluid traveling through the solar cell to high temperatures for power generation. An alternative type of solar conversion mechanism, more adaptable for use in thin panels and more compact devices, uses photovoltaic (PV) materials to convert sunlight directly into electrical energy. Photovoltaic materials may be formed from various types of silicon and other semiconductor materials and are manufactured using semiconductor fabrication techniques and provided by a number of manufacturers, such as Emcore Photovoltaics, Albuquerque, N.M., for example. While silicon is less expensive, higher performance photovoltaic materials are alloys made from elements such as aluminum, gallium, and indium, along with elements such as nitrogen and arsenic.

As is well known, sunlight is highly polychromatic, containing broadly distributed spectral content, ranging from ultraviolet (UV), through visible, and infrared (IR) wavelengths, each wavelength having an associated energy level, typically expressed in terms of electron-volts (eV). Not surprisingly, due to differing band-gap characteristics between semi-conductor materials, the response of any one particular photovoltaic material depends upon the incident wavelength. Photons having an energy level below the band gap of a material slip through. For example, red light photons (nominally around 1.9 eV) are not absorbed by high band-gap semiconductors. Meanwhile, photons having an energy level higher than the band gap for a material are absorbed. For example, excess energy from violet light photons (nominally around 3 eV) is wasted as heat in a low band-gap semiconductor.

One strategy for obtaining higher efficiencies from photovoltaic materials is to form a stacked photovoltaic cell, also sometimes termed a multifunction photovoltaic device. These devices are formed by stacking multiple photovoltaic cells on top of each other. With such a design, each successive photovoltaic cell in the stack, with respect to the incident light source, has a lower band-gap energy. In a simple stacked photovoltaic device, for example, an upper photovoltaic cell, consisting of gallium arsenide (GaAs), captures the higher energy of blue light. A second cell, of gallium antimonide (GaSb), converts the lower energy infrared light into electricity. One example of a stacked photovoltaic device is given in U.S. Pat. No. 6,835,888 entitled "Stacked Photovoltaic Device" to Sano et al.

While stacked photovoltaics can provide some measure of improvement in overall efficiency, these multilayered devices can be costly to fabricate. There can also be restrictions on the types of materials that can be stacked together atop each other, making it difficult for such an approach to prove economical for a broad range of applications. Another approach is to separate the light according to wavelength into two or more spectral portions, and to concentrate each portion onto an appropriate photovoltaic receiver device, with two or more photovoltaic receivers arranged side by side. With this approach, photovoltaic device fabrication is simpler and less costly, and a wider variety of semiconductors can be considered for use. This type of solution requires supporting optics for both separating light into suitable spectral components and concentrating each spectral component onto its corresponding photovoltaic surface.

One proposed solution for simultaneously separating and concentrating light at sufficient intensity is described in a paper entitled "New Cassegrainian PV Module using Dichroic Secondary and Multijunction Solar Cells" presented at an International Conference on Solar Concentration for the Generation of Electricity or Hydrogen in May, 2005 by L. Fraas, J. Avery, H. Huang, and E. Shifman. In the module described in this article and schematically represented in FIG. 1B, curved primary mirror 12 collects light and directs this light toward a dichroic hyperbolic secondary mirror 14, near the focal plane of the primary mirror. IR light is concentrated at a first photovoltaic receiver 16 near the focal point of the primary mirror. The secondary mirror redirects near-visible light to a second photovoltaic receiver 18 positioned near the vertex of the primary mirror. In this way, each photovoltaic receiver 16 and 18 obtains the light energy for which it is optimized, increasing the overall efficiency of the solar cell system.

While the approach shown in the Fraas paper advantageously provides spectral separation and concentrates light using the same set of optical components, there are some significant limitations to the solution that it presents. A first problem relates to the overall losses due to obstruction of the aperture, as were noted earlier. As another problem, the apparatus described by Fraas et al. has a limited field of view of the sky because it has a high concentration in each axis due to its rotational symmetry. Yet another drawback relates to the wide bandwidths of visible light provided to a single photovoltaic receiver. With many types of photovoltaic materials commonly used for visible light, an appreciable amount of the light energy would still be wasted using such an approach, possibly resulting in excessive heat.

Dichroic surfaces, such as are used for the hyperbolic mirror in the solution proposed in the Fraas paper, provide spectral separation of light using interference effects obtained from coatings formed from multiple overlaid layers having different indices of refraction and other characteristics. In operation, dichroic coatings reflect and transmit light as a function of incident angle and wavelength. As the incident angle varies, the wavelength of light that is transmitted or reflected by a dichroic surface also changes. Where a dichroic coating is used with incident light at angles beyond about +/−20 degrees from normal, undesirable spectral effects can occur, so that spectral separation of light, due to variations in the angles of incidence, is compromised at such higher angles.

There have been a number of light collector solutions employing dichroic surfaces for spectral splitting. For example, in an article entitled "Spectral Beam Splitting Technology for Increased Conversion Efficiency in Solar Concentrating Systems: A Review", available online at www-.sciencedirect.com, authors A. G. Imenes, and D. R. Mills provide a survey of solar collection systems, including some using dichroic surfaces. For example, the description of a tower reflector (FIG. 24 in the Imenes and Mills article) shows one proposed solution that employs a curved dichroic beamsplitter as part of the optics collection system. High incident angles of some portion of the light on this surface could render such a solution as less than satisfactory with respect to light efficiency. Similarly, U.S. Pat. No. 4,700,013 entitled "Hybrid Solar Energy Generating System" to Soule describes the use of a dichroic surface as a selective heat mirror. However, as noted in the Imenes article cited above, the approach shown in the Soule '013 patent exhibits substantial optical losses. Some of these losses relate to the high incident angles of light directed to the selective heat mirror that is used.

There are inherent problems with dichroic surface shape and placement for light focused from a parabolic mirror. A flat dichroic surface positioned near the focal region of a parabolic reflector would exhibit poor separation performance for many designs, constraining the dimensions of a light collection system. A properly curved dichroic surface, such as a hyperbolic surface, can be positioned at or near the focal region, but obstructs some portion of the available light, as noted earlier.

FIG. 1C shows a simplified version of a conventional solution that has been proposed in numerous embodiments for spectral separation in a radiant energy collection apparatus using a flat dichroic beamsplitter 20. Incident light is concentrated by a lens 22 and directed to beamsplitter 20, oriented at 45 degrees, which reflects one portion of the spectral band to first photovoltaic receiver 16 and transmits another portion of the spectral band to second photovoltaic receiver 18. This general type of solution is described as a "lateral optical system" in a paper entitled "50% Efficient Solar Cell Architectures and Designs" by Barnett et al. presented at 2006 IEEE $4^{th}$ World Conference on Photovoltaic Energy-Conversion. FIGS. 19, 23, and 24 in the Inenes et al. article cited earlier show some of the alternative configurations based on this general solution.

The lateral optical type of system exhibits good optical transmission levels but has relatively low efficiency. This is at least partly due to a significant amount of spectral contamination resulting from the relatively high incident angles of light on the dichroic surface of beamsplitter 20. Dichroic coatings reflect and transmit light as a function of incident angle and wavelength. As the incident angle varies, the wavelength of light that is transmitted or reflected also changes. Thus, the spectral content of the light reflected from beamsplitter 20 varies over the surface of receivers 16 and 18, reducing the efficiency of energy conversion.

Against obstacles such as poor dichroic surface response, conventional approaches have provided only a limited number of solutions for achieving, at the same time, both good spectral separation and efficient light flux concentration of each spectral component. The Cassegrain model of FIGS. 1A and 1B can be optimized, but always presents an obstruction near the focal point of the primary mirror, and is thus inherently disadvantaged. Solutions that employ dichroic separation perform best where incident light angles on the dichroic surface are low with respect to normal; however, as exemplified in FIG. 1C, many proposed designs do not appear to give enough consideration to these spectral separation characteristics, resulting in poor separation or misdirected light and reduced efficiency.

Thus, it is recognized that there is a need for a photovoltaic cell that provides improved spectral separation and light concentration, that can be easily scaled for use in a thin panel design, that can be readily manufactured, and that offers increased efficiency over conventional photovoltaic solutions.

SUMMARY OF THE INVENTION

It is an object of the present invention to advance the art of light collection and spectral separation. With this object in mind, the present invention provides an apparatus for obtaining energy from a polychromatic radiant energy source, the apparatus comprising:

a) a light concentrator for concentrating and redirecting incident radiant energy, the light concentrator having an optical axis;

b) a spectral separator spaced apart from the light concentrator and disposed along the optical axis and in the path of concentrated, redirected radiant energy, the spectral separator comprising:

(i) a first planar surface treated to reflect a first spectral band of light received from the light concentrator toward a first focal region and to transmit a second spectral band;

(ii) a second planar surface spaced apart from the first planar surface and oblique with respect to the first planar surface, wherein the second planar surface is treated to reflect the second spectral band back through the first planar surface and toward a second focal region that is spaced apart from the first focal region;

and c) first and second light receivers, wherein the first light receiver is disposed nearest the first focal region for receiving the first spectral band and the second light receiver is disposed nearest the second focal region for receiving the second spectral band.

It is a feature of the present invention that it provides both spectral separation of light into at least two spectral bands and concentration of each separated spectral band onto a receiver.

It is an advantage of the present invention that it can provide improved efficiency for concentrating radiant energy onto photoreceivers by directing light toward the surface of the spectral separator at small angles of incidence.

These and other objects, features, and advantages of the present invention will become apparent to those skilled in the art upon reading the following detailed description in conjunction with the drawings, which show and describe an illustrative embodiment of the invention.

DETAILED DESCRIPTION OF THE INVENTION

Figure 1A:
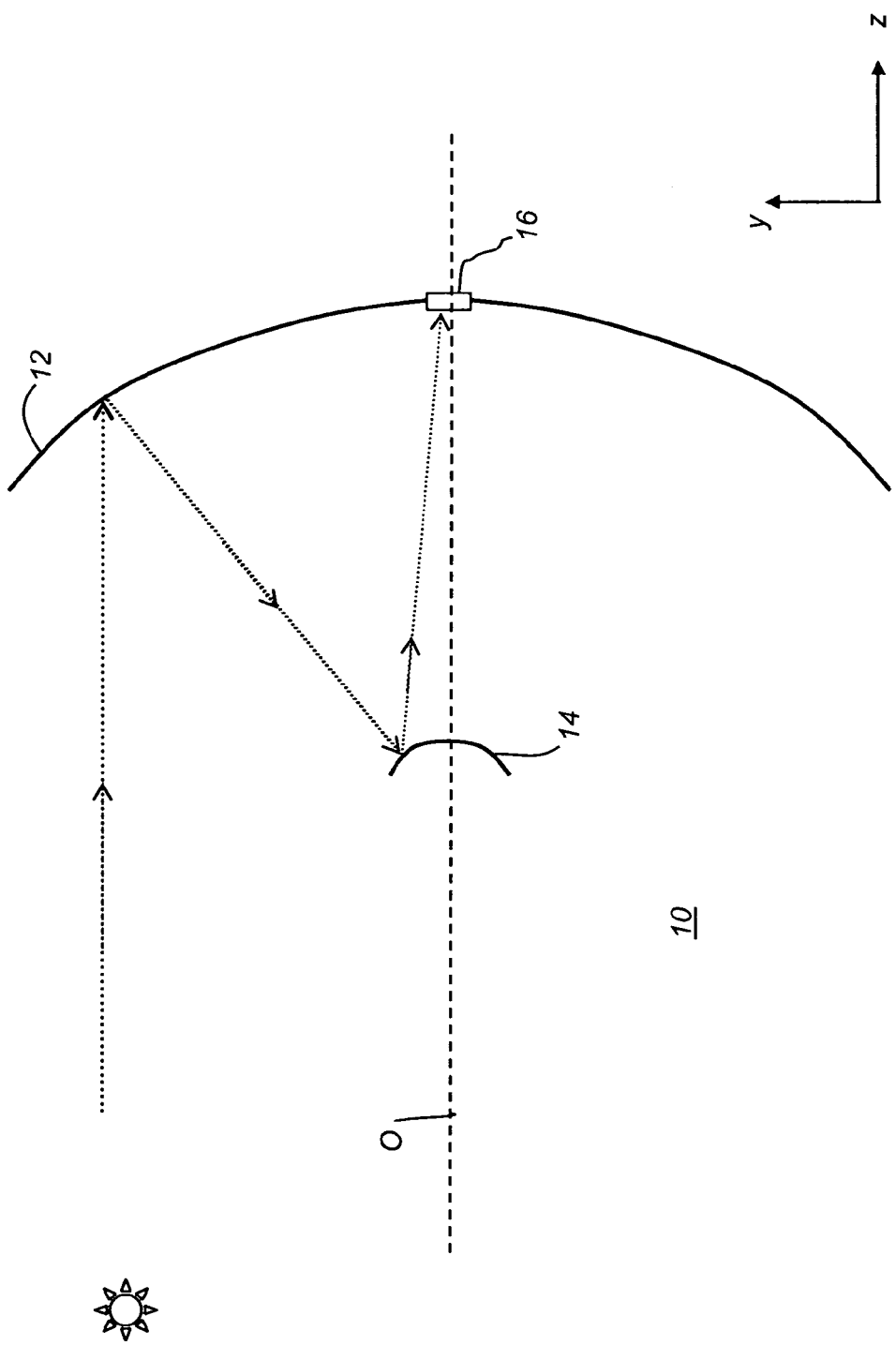
FIG. 1A is a schematic drawing showing a light collector using the Cassegrain model.
Figure 1B:
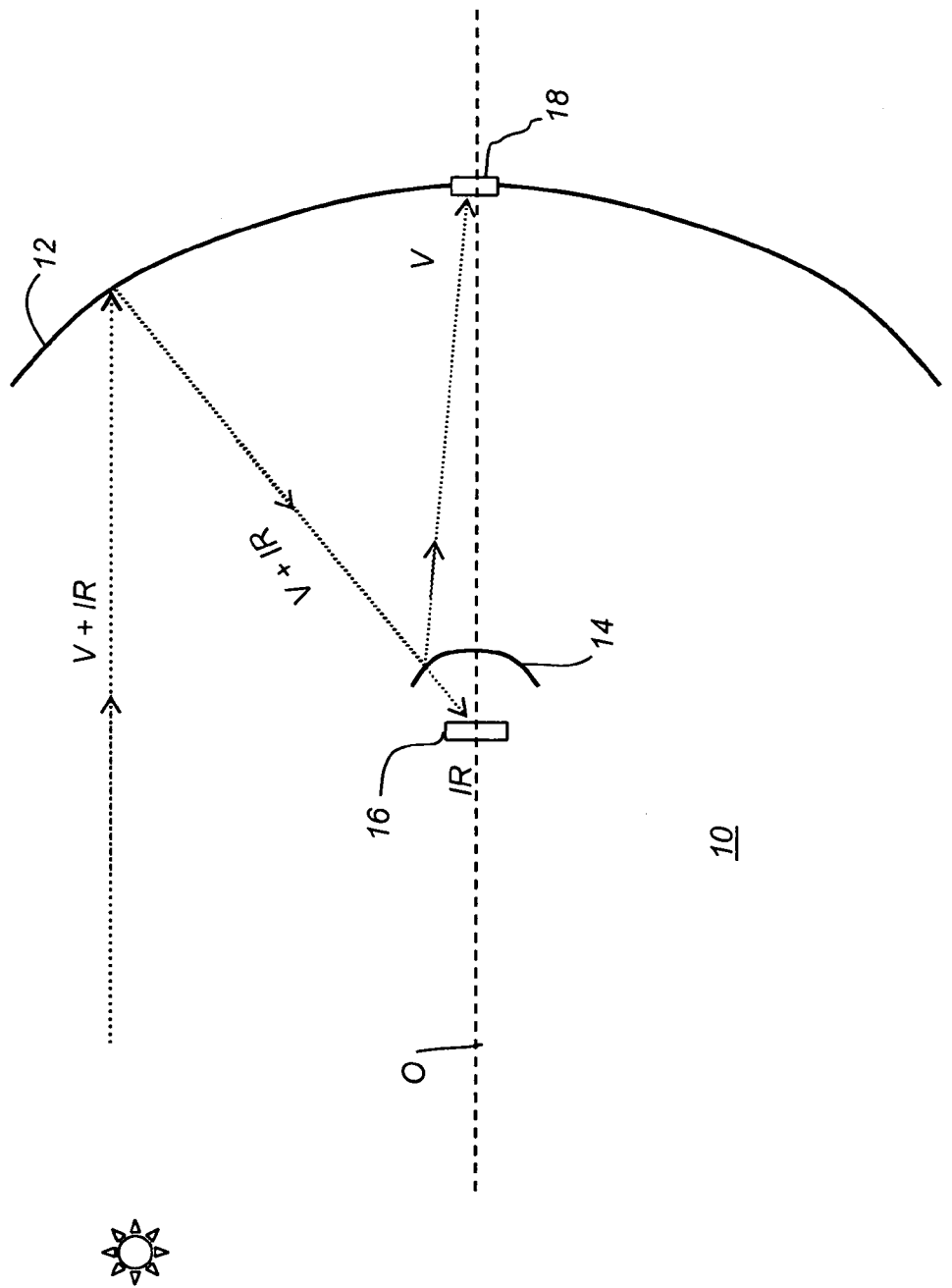
FIG. 1B is a schematic drawing showing a light collector using the Cassegrain model, with a curved dichroic surface.
Figure 1C:
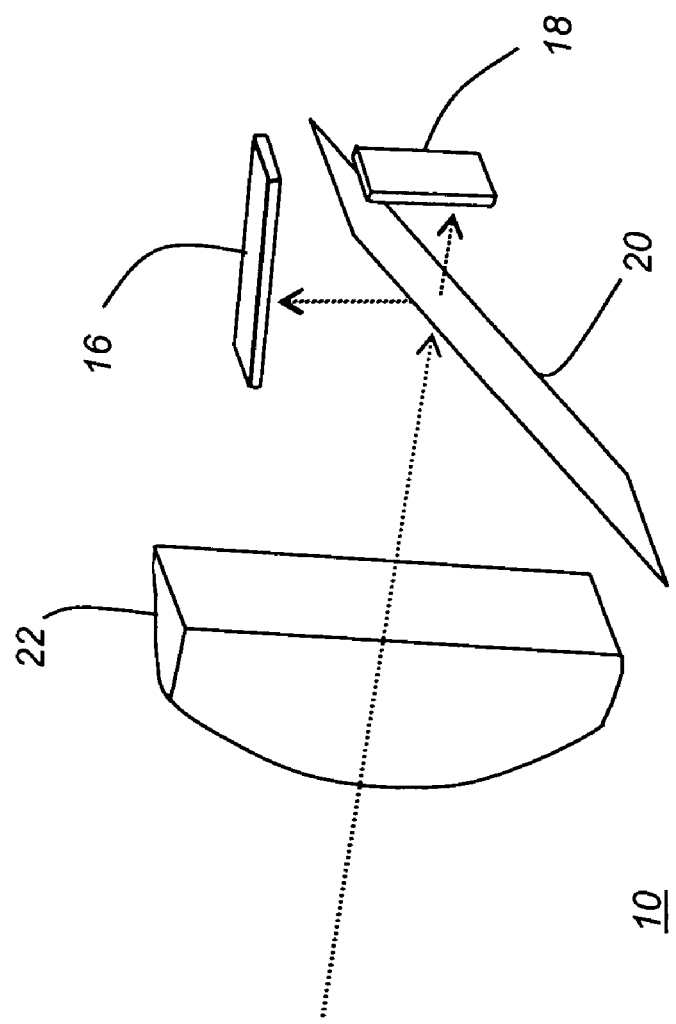
FIG. 1C is a schematic drawing showing a light collector using a beamsplitter in a conventional arrangement for spectral separation.

The present invention provides a light concentrator providing both enhanced spectral separation and a high degree of light flux concentration, exceeding the capabilities afforded by earlier approaches. The light concentrator of the present invention can be used as an optical component of a photovoltaic cell, embodied either as a discrete cell or as part of a photovoltaic cell array. While the apparatus of the present invention is well suited to photovoltaic applications, its utility is broader in scope, so that it can be used in any application where it is beneficial to obtain concentrated light energy that has been spectrally separated.

The term "light" as used in this disclosure broadly refers to radiant energy in the electromagnetic spectrum, with "polychromatic light" spanning wavelengths that include infrared light, visible light, and ultraviolet light. Throughout this specification, references are made to portions of the electromagnetic spectrum that have relatively lower or higher energy levels, according to wavelength. As will be apparent to those skilled in the photovoltaic art, the threshold between lower energy light and higher energy light depends, in large part, on characteristics of the photovoltaic receivers used. While the subsequent description may give example threshold values used in some embodiments, the apparatus and methods of the present invention can be more broadly applied where the threshold value varies over a wide range.

The term "oblique angle" has its conventional meaning, as either greater than or less than a right (90 degree) angle and not parallel with respect to its reference.

The term "optical axis" has its conventional meaning for each of the embodiments described subsequently. With rotationally symmetrical optics, the optical axis simply corresponds to the axis of rotational symmetry. However, with asymmetric optics, the optical axis is more generally defined as the path taken by a ray that is centered in the aperture of the light-concentrating optical component. For cylindrical optics, there may be an axis of symmetry with respect to a plane; this may or may not correspond to the optical axis. With a cylindrical optical device, the optical axis is in the plane where there is optical power, orthogonal to the direction along which the cylindrical device is extended. For clarity, the term optical axis is used in the following description as relative to a single refractive or reflective optical component, rather than relative to the larger optical system that comprises multiple components. The more general term "optical path" is used herein to describe the path taken by a particular spectral component of light in the optical system of the present invention.

The figures referenced in this description illustrate the general concepts and key structures and components of the apparatus of the present invention. These figures are not drawn to scale and may exaggerate dimensions and relative placement of components for the sake of clarity. In addition, angles of refraction, if represented, are exemplary only and will vary depending on dielectric materials used and the angle of incident light. The spectral bands described herein are given by way of example and not of limitation.

As is well known, the light concentration that is obtained by a specific optical system depends on its overall geometry. For example, a perfect rotationally symmetrical paraboloid reflector would ideally direct collimated light to a "focal point". A cylindrical parabolic reflector, having optical power along only one axis, would ideally direct collimated light to a "focal line". However, as is familiar to those skilled in optical fabrication, only a reasonable approximation to such idealized geometric shapes can be realized in practice and neither a perfect focal point nor a perfect focal line are achievable or needed for efficient light concentration. Thus, instead of using the idealized "focal point" or "focal line" terminology, the description and claims of the present invention employ the more general term "focal region". In subsequent description, the focal region for an optical structure is considered to be the spatial zone or vicinity of highest light concentration from that structure.

Figure 2A:
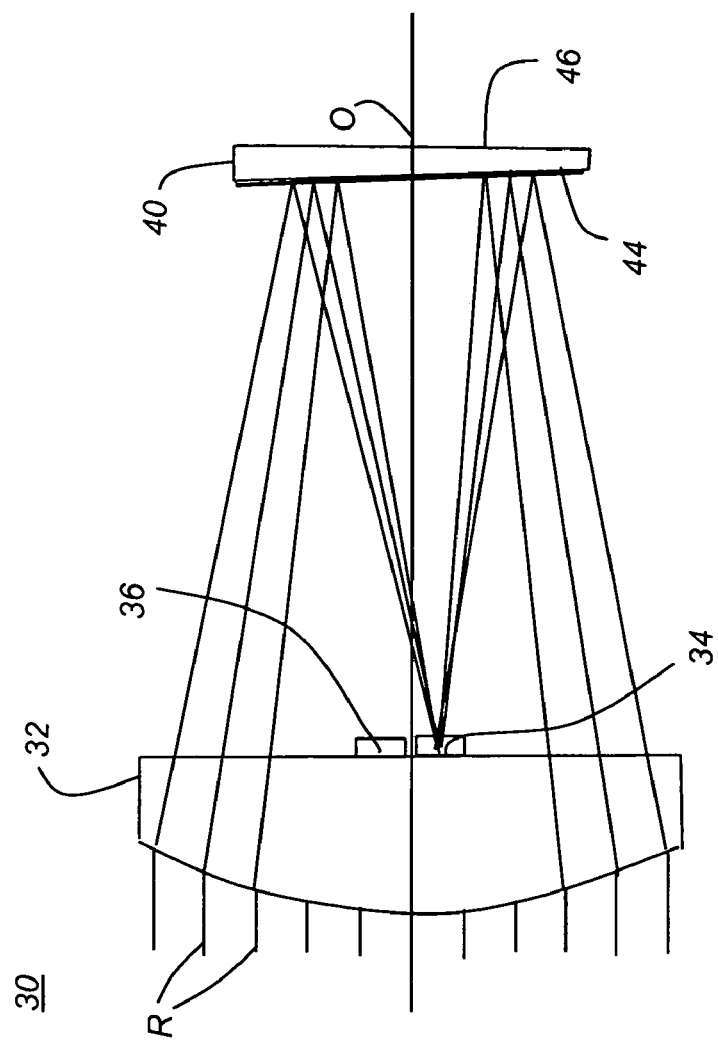
FIGS. 2A and 2B are schematic drawings that show, for one embodiment, light paths for higher- and lower-energy light, respectively.
Figure 2B:
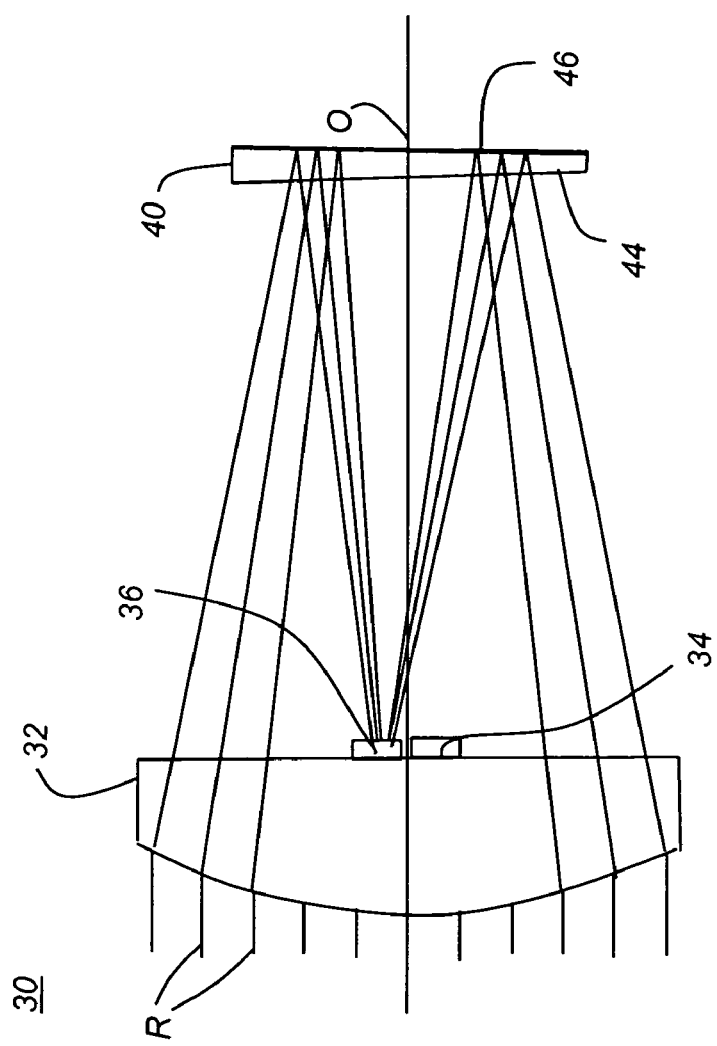
Figure 3:
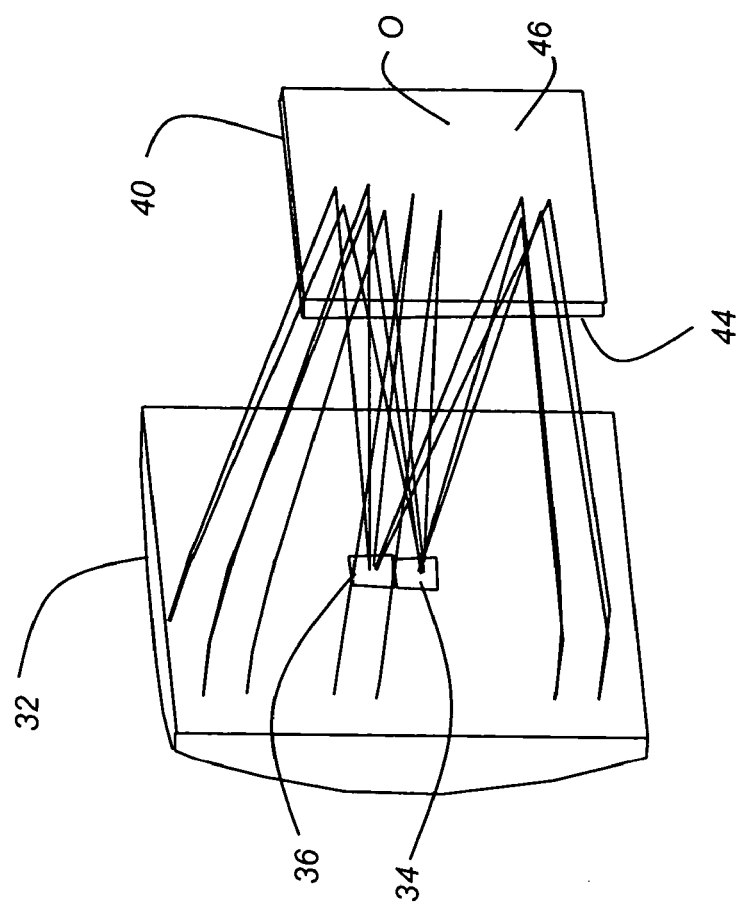
FIG. 3 is a perspective view of one embodiment of the present invention.

The side view cross sections of FIGS. 2A and 2B and perspective view of FIG. 3 show a photovoltaic apparatus 30 for obtaining radiant energy from the sun or other polychromatic light source according to the present invention. A light concentrator 32 directs the polychromatic light toward a spectral separator 40 that redirects one spectral portion of this incident light to a first receiver 34 as shown for representative rays R in FIG. 2A and another spectral portion of the light to a second receiver 36 as shown in FIG. 2B. First and second receivers 34 and 36 are disposed substantially at the appropriate focal region for light of the corresponding spectral bands. That is, the first light receiver is disposed nearest the first focal region for receiving the first spectral band and the second light receiver is disposed nearest the second focal region for receiving the second spectral band.

Spectral separator 40 is wedge-shaped, having two planar reflective surfaces: a dichroic surface 44 and a reflective surface 46. Dichroic surface 44 is treated with a coating that reflects light at shorter wavelengths toward first receiver 34 and transmits longer wavelengths. Reflective surface 46, a broadband reflector, reflects the longer wavelengths back through dichroic surface 44 and onto second receiver 36. Reflective surface 46 could be a highly reflective mirrored surface or could also be provided with a dichroic coating.

Dichroic surface 44 and reflective surface 46 are not parallel, but are oblique with respect to each other to form a wedge shape. In the embodiments of FIGS. 2A and 2B, surfaces 44 and 46 are generally formed on opposite sides of a substantially transparent optical material, such as glass or other solid dielectric material; however, surfaces 44 and 46 could be separated by air in an alternate embodiment. An optical axis O for light concentrator 32 is at an angle other than normal to at least one of dichroic surface 44 and reflective surface 46. For the overall optical system of photovoltaic apparatus 30, spectral separator 40 effectively provides separate optical paths for longer and shorter wavelength light. As shown in FIGS. 2A and 2B, longer and shorter wavelength light paths can be directed to either side of the light concentrator 32 optical axis O, to receivers 36 and 34 that obstruct a portion of the aperture of light concentrator 32. Alternately, as shown in subsequent embodiments, either or both longer and shorter wavelength light paths can be directed to receivers 36 and 34 that are disposed outside the aperture of light concentrator 32.

The optical configuration of FIGS. 2A and 2B is advantaged over other photovoltaic device designs with respect to incident light angles. Incident polychromatic light that is directed to dichroic surface 44 is at angles that are relatively slight with respect to normal, providing good dichroic performance and, as a result, improved efficiency.

The highest concentration for conversion of light is achieved when light is substantially focused on receivers 34 and 36. There is some small amount of chromatic aberration when light concentrator 32 is a refractive component such as a lens. As an effect of chromatic aberration by refractive concentrator 32, longer wavelengths have a longer optical path length than do shorter wavelengths, thus coming to focus at a distance that is incrementally further than the focal distance for shorter wavelengths. In one embodiment, this slight optical path length difference simply means that receivers 34 and 36 do not lie within the same plane, but are offset a bit from each other. However, in another embodiment, it is desirable to mount both receivers 34 and 36 substantially within the same plane, such as when mounting these devices to a flat plate or to a plastic or glass sheet, for example. In such a case, this optical path length difference can be compensated by proper selection of the dielectric material that is used between dichroic surface 44 and reflective surface 46 within spectral separator 40. As is well known in the optical arts, the amount of optical path compensation that can be provided by such a dielectric material is proportional to its thickness and inversely proportional to its index of refraction. (It is also instructive to note that the light that reflects from reflective surface 46 is transmitted through this dielectric material in both incident and outbound directions, thus doubling the optical path compensation effect of a given thickness of dielectric material.)

As with Cassegrain solutions, as noted earlier, the embodiment of FIG. 3 exhibits the problem of obstruction of a portion of the aperture of light concentrator 32, since receivers 34 and 36 lie in the path of incident light. However, this obstruction is proportionally less than it would be for a Cassegrain solution because the obstruction lies at the focal region. The embodiment of FIGS. 4 and 5 correct for this obstruction problem by shifting the angular orientation of spectral separator 40 with respect to optical axis O of light concentrator 32. As is shown in the perspective view of FIG. 4, spectral separator 40, having wedged surfaces 44 and 46 as described with respect to the preceding embodiment, receives light that is refracted by light concentrator 32. Spectral separator 40 is positioned along optical axis O, conventionally assigned as the z axis, but has at least one surface 44, 46 that is not normal to the z axis and is tilted or oblique with respect to at least one of the orthogonal x and y axes. In the nomenclature used in FIG. 4, rotation about the y axis is labeled α;

rotation about the x axis is labeled β. As a result of this tilt, the focal regions for the respective receivers 34 and 36 shift away from the optical axis O of light concentrator 32 and away from the aperture, to one side of light concentrator 32.

Figure 4:
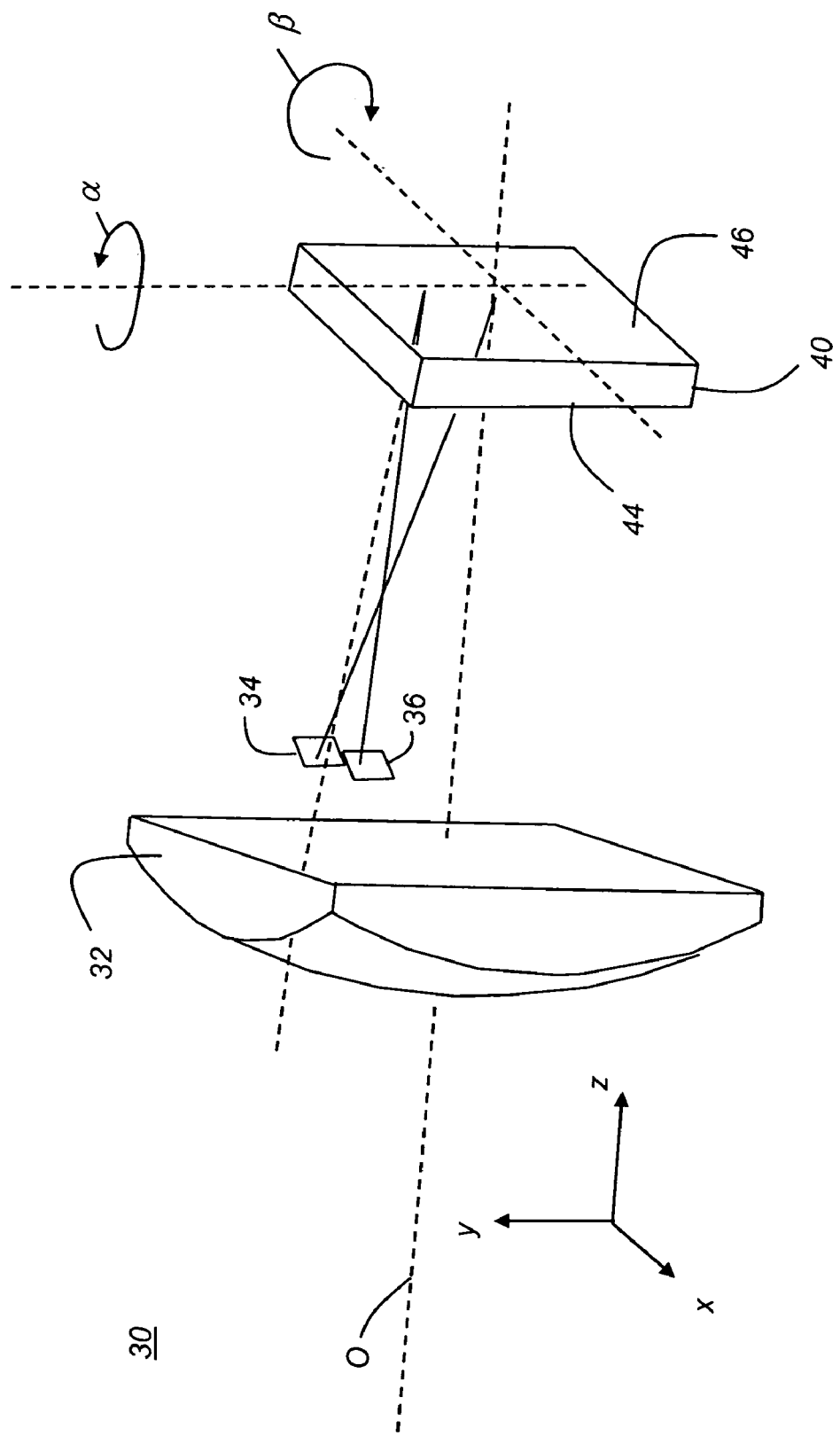
FIG. 4 is a perspective view of an alternate embodiment with light receivers shifted to one side of the optical path.
Figure 5:
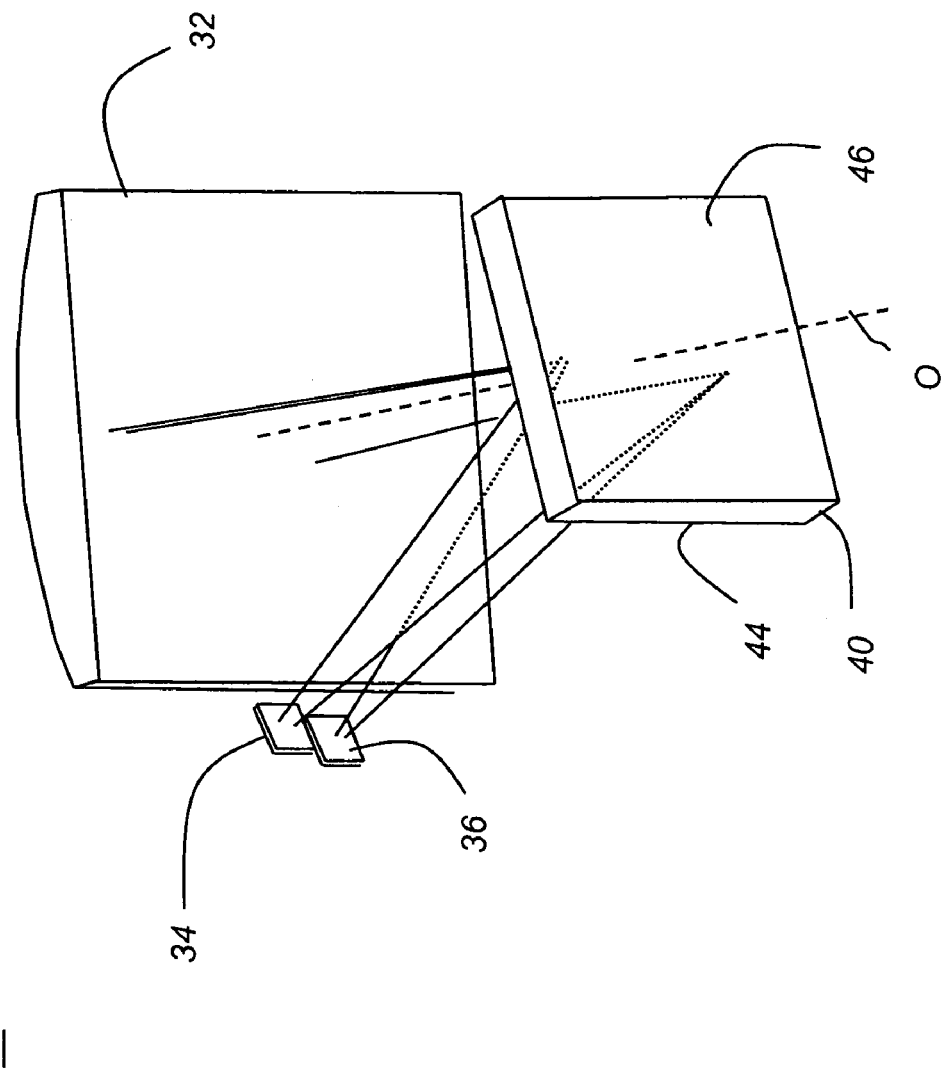
FIG. 5 is a perspective view of an alternate embodiment with light receivers shifted to the other side of the optical path.

The arrangement of FIGS. 4 and 5 is also advantaged for reduced incidence angles on the dichroic surface or surfaces 44 and 46 of spectral separator 40. Because this embodiment shifts receivers 34 and 36 out of the path of incident light and thus outside the aperture of light concentrator 32, efficiency gains can be obtained with this approach.

Figure 6:
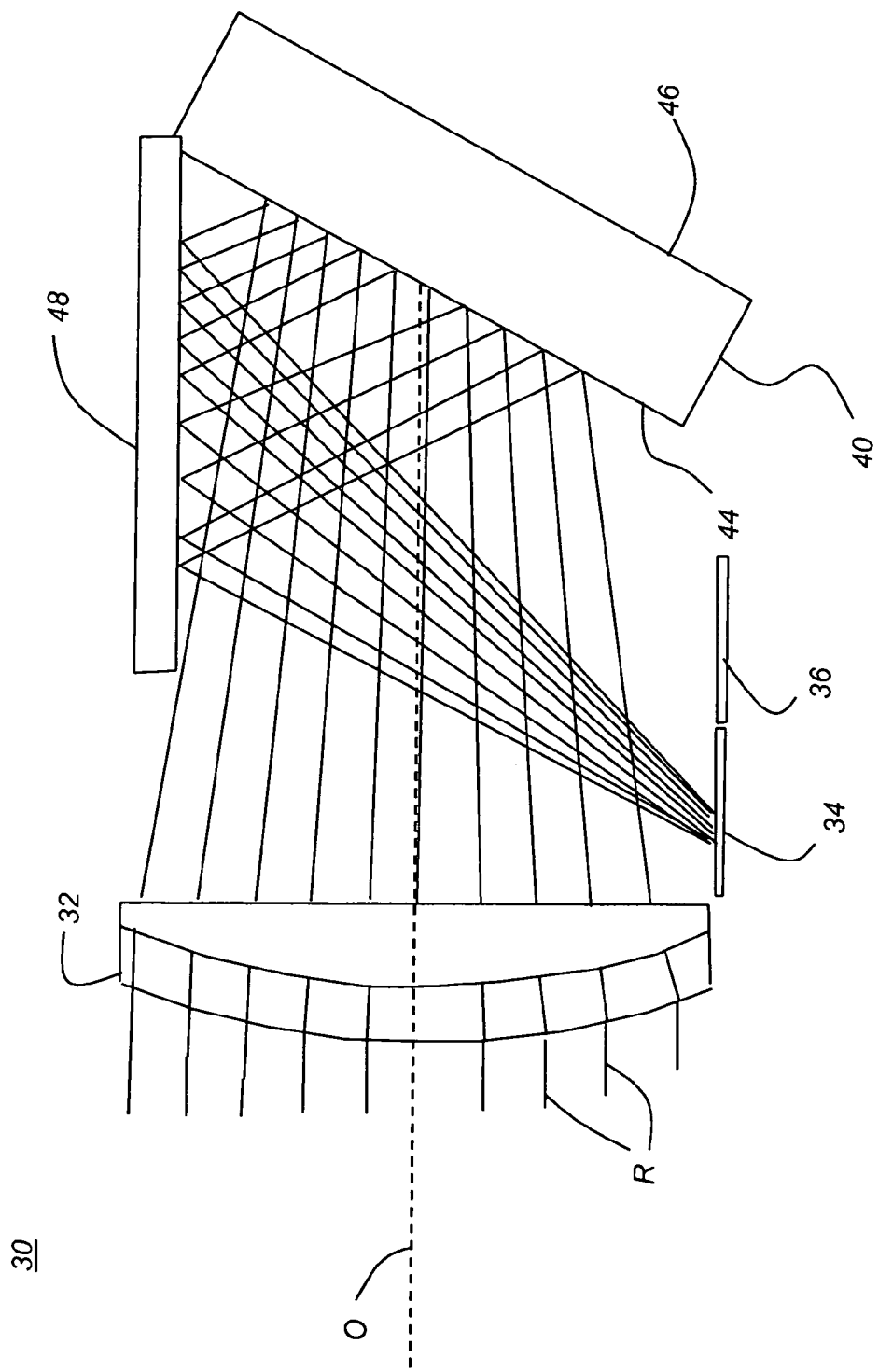
FIG. 6 is a schematic view showing the path of higher energy light in an embodiment with folded optical paths.
Figure 7:
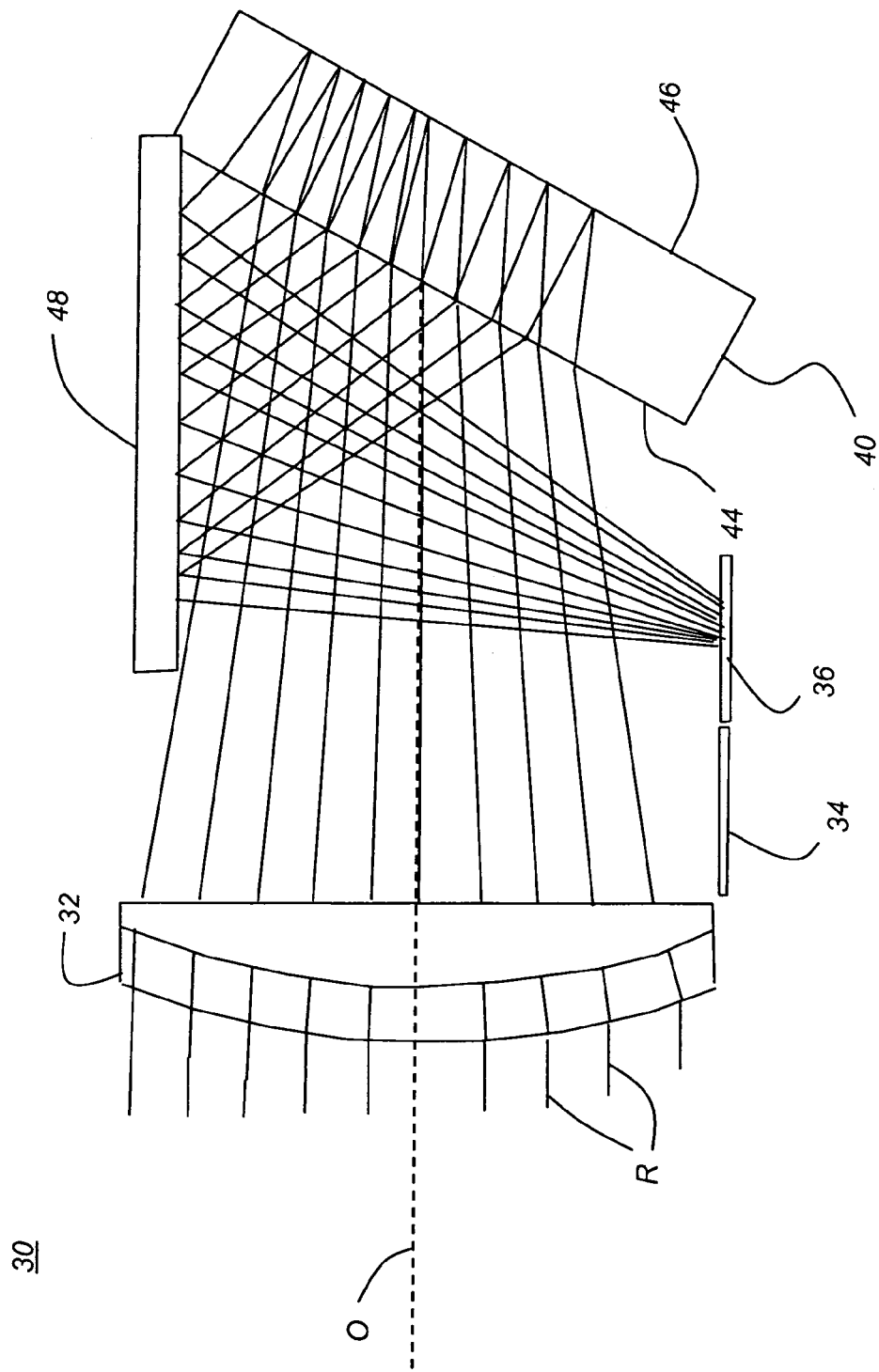
FIG. 7 is a schematic view showing the path of lower energy light in an embodiment with folded optical paths.

There can be advantages to configurations that fold the optical path of the separated light to obtain a longer focal length. Referring to FIGS. 6 and 7, there is shown an embodiment of photovoltaic apparatus 30 with a fold mirror 48 or other suitable reflective surface in the optical path. Spectral separator 40 is shown having increased thickness. Here, reflective surface 46 can be formed using silver or gold on fused silica. As is shown in the light paths of FIG. 6, higher energy light is reflected from dichroic surface 44 and directed to receiver 34 via mirror 48. As is shown in FIG. 7, lower energy light passes through dichroic surface 44, is refracted in spectral separator 40, and reflected from reflective surface 46. This lower energy light passes through dichroic surface 44 once again and is directed to receiver 36 via mirror 48.

Figure 8:
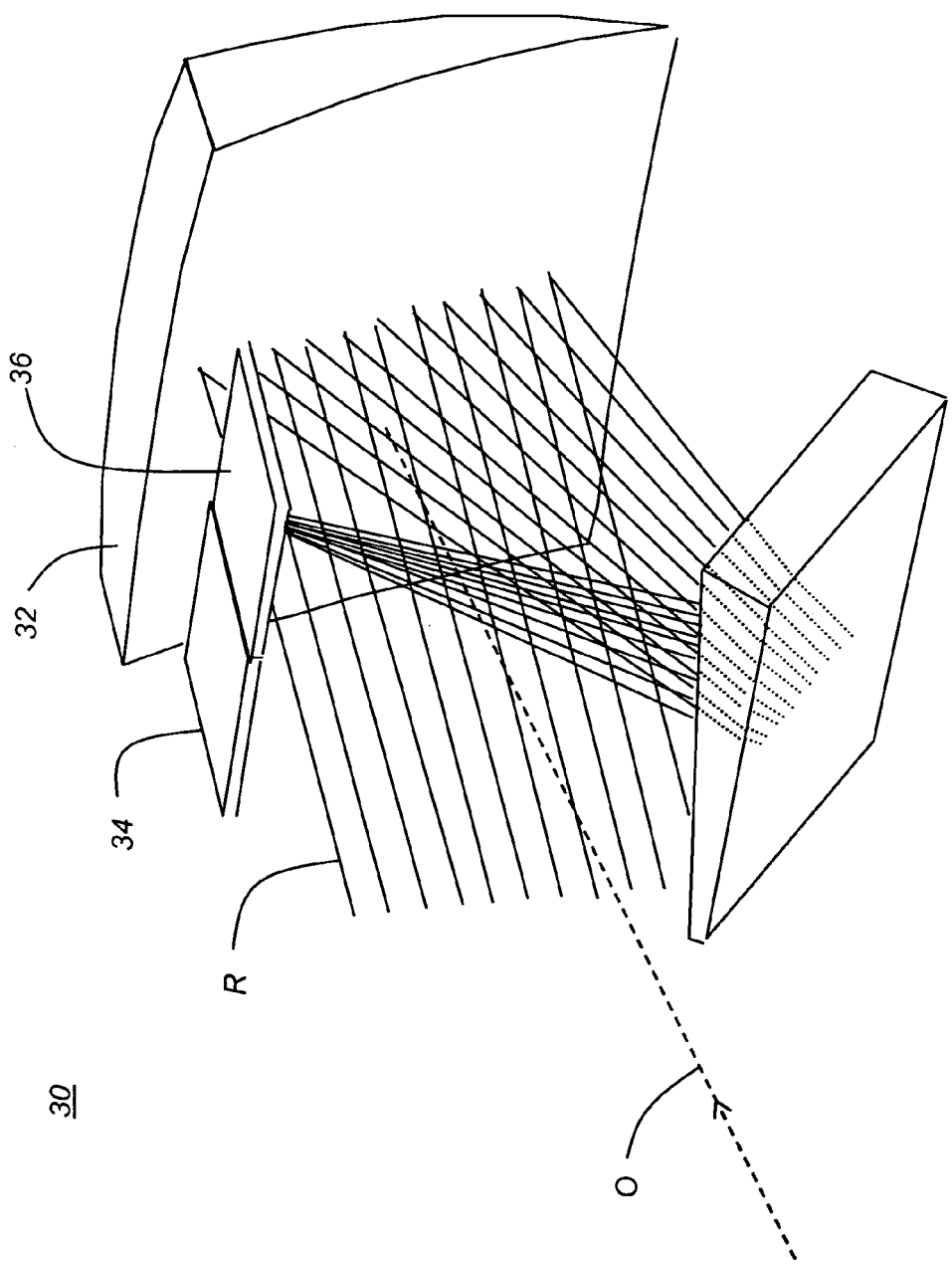
FIG. 8 is a perspective view showing an embodiment using a reflective light concentrator and showing the path for low-energy light.
Figure 9:
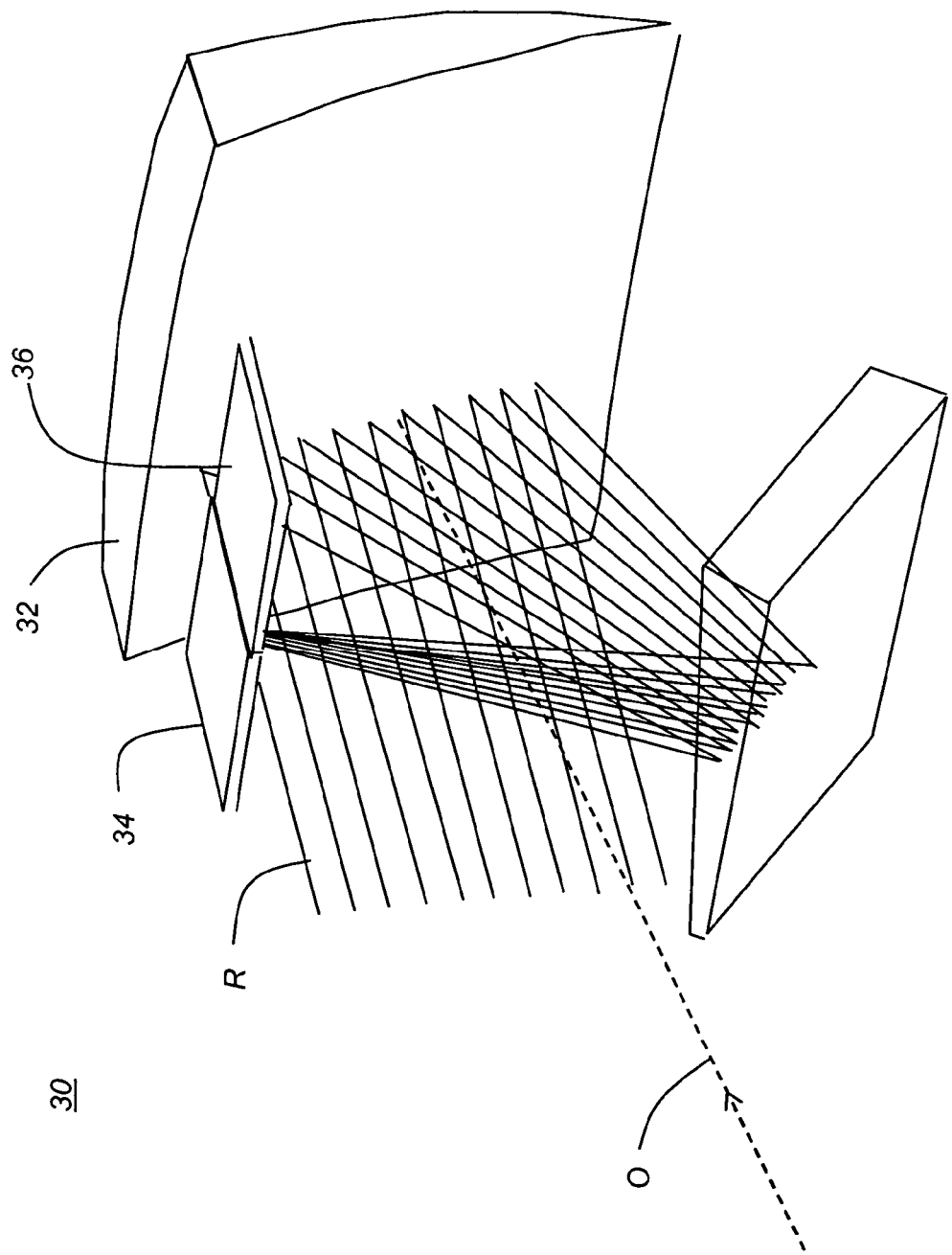
FIG. 9 is a perspective view showing an embodiment using a reflective light concentrator and showing the path for high-energy light.

As was noted with respect to FIGS. 2A and 2B, refractive light concentrators generally exhibit some amount of chromatic aberration. FIGS. 8 and 9 show an off-axis aspheric embodiment using a reflective light concentrator 32 that eliminates this problem. Incoming polychromatic light, as shown by representative rays R, is reflected from the surface of reflective light concentrator 32, a parabolic mirror in one embodiment, with incoming light off axis as shown in FIGS. 8 and 9. The light is directed toward spectral separator 40 which splits the light into two spectral bands and directs each spectral band to its corresponding receiver 34 or 36.

The embodiments of FIGS. 2A through 9 have been shown in air. However, the same concepts, using an optical concentrator and wedge-shaped surfaces for spectral separation, are applicable to embodiments that direct light to reflective components through a solid dielectric medium. The embodiments of FIGS. 10A, 10B, 10C, 11, 12, 13, 14, and 15 show embodiments of photovoltaic apparatus 30 formed using a solid dielectric medium, such as glass or an optical plastic. These embodiments can be cylindrical, extending along an axis orthogonal to the direction of its highest optical power (normal to the page as drawn). The first and second focal regions for lower and higher energy light are then linear. Photovoltaic apparatus 30 could alternately be toroidal, with optical power along two orthogonal axes.

Figure 10A:
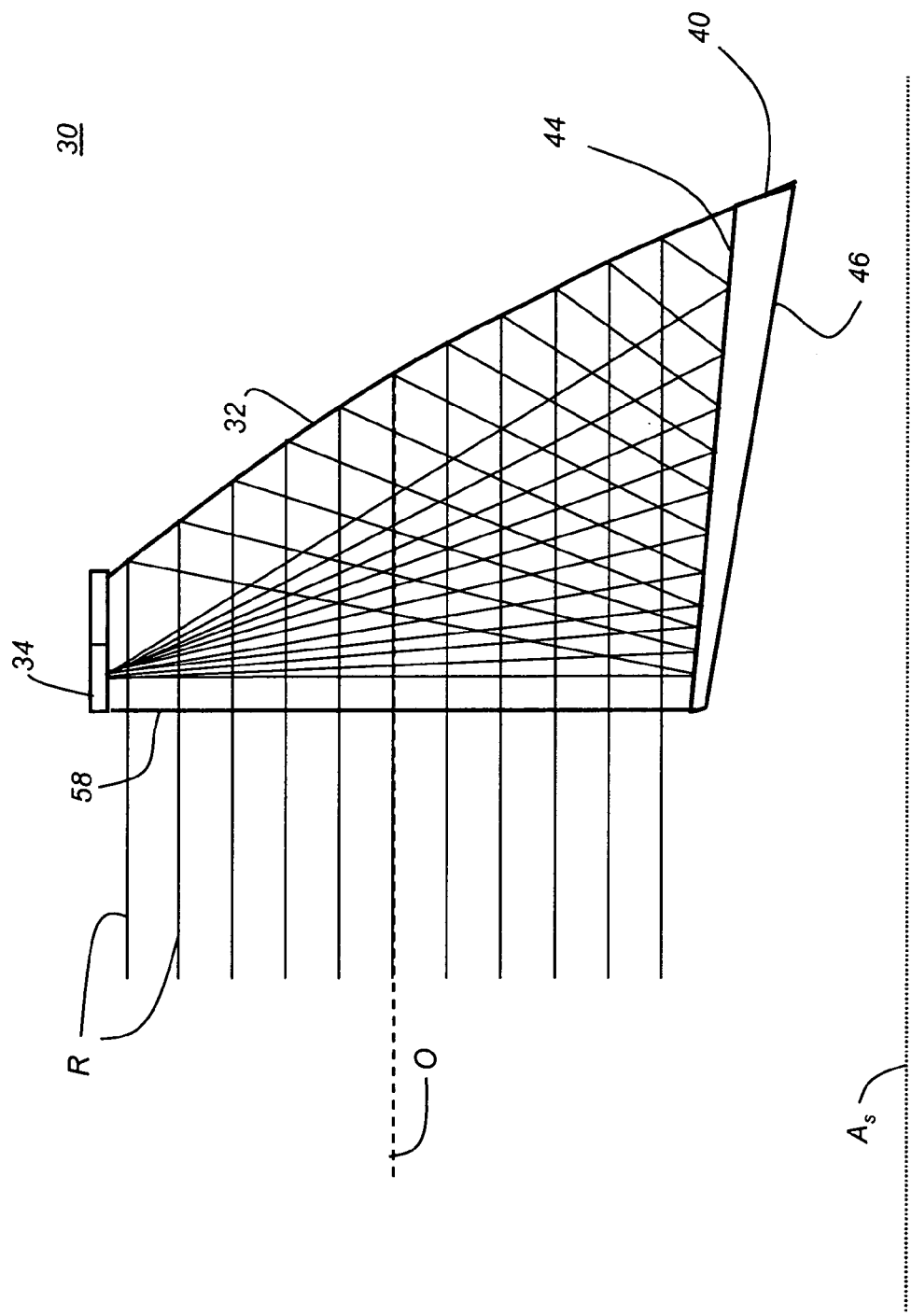
FIGS. 10A, 10B, and 10C are schematic diagrams that show light handling using an off-axis reflective parabola design for high-energy light, lower-energy light, and off-axis light respectively.
Figure 10B:
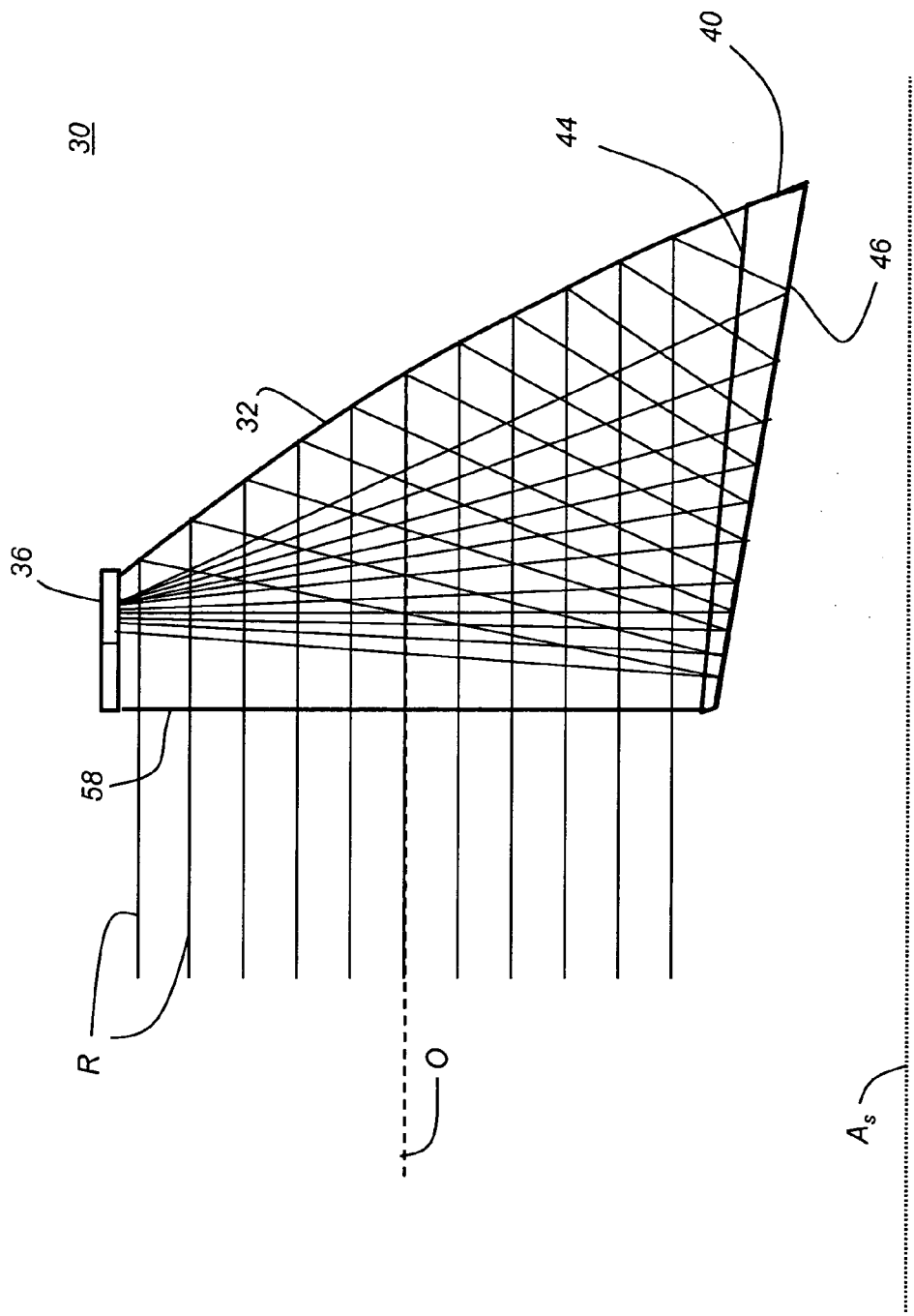

FIGS. 10A and 10B show another embodiment using off-axis aspheric optical design to provide a photovoltaic apparatus 30 having a wide field of view (FOV). Although different in appearance, the aspheric design of FIGS. 10A and 10B operates in similar manner to the embodiment of FIGS. 8 and 9, with spectral separation and redirection varying depending on the angle and spectral content of the incident polychromatic light. This embodiment is particularly adaptable to a cylindrical arrangement, with optical components of photovoltaic apparatus 30 formed of, and formed onto, a solid dielectric medium such as glass or optical plastic. FIG. 10A shows the optical path for higher energy light of one spectral band; FIG. 10B shows the optical path for lower energy light of longer wavelengths. Incident light at an input face 58 is directed to light concentrator 32, an off-axis reflective aspheric surface in this embodiment. The axis of rotational symmetry $A_s$ (in the cross-sectional plane of the page) is below the parabola in the orientation shown in FIGS. 10A and 10B. Light concentrator 32 concentrates the incident polychromatic light, directing it toward spectral separator 40. Spectral separator 40 splits high-energy light from low-energy light. For example, in one embodiment, spectral separator 40 separates spectral bands at near-infrared wavelengths, nominally above and below about 750 nm. Dichroic surface 44 reflects high-energy light to receiver 34 and transmits lower energy light, as best shown in FIG. 10A. Reflective surface 46 reflects the transmitted lower energy light back through dichroic surface 44 and toward receiver 36, as best shown in FIG. 10B.

Figure 10C:
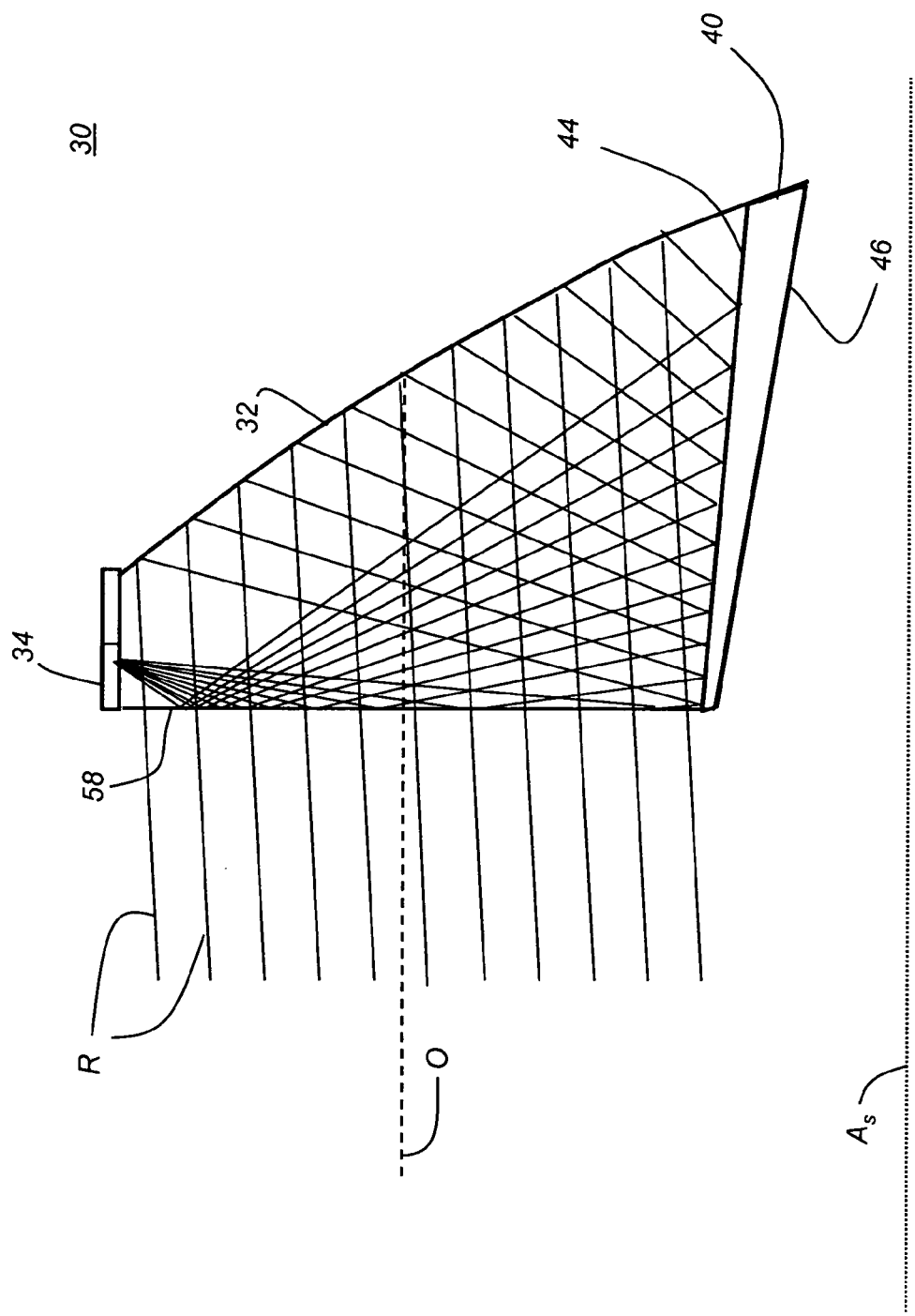

One advantage of embodiments that are solid (that is, formed using a dielectric material) rather than in air relates to field of view (FOV). FIG. 10C shows schematically how an expanded FOV is available due to total internal reflection (TIR). In FIG. 10C, photovoltaic apparatus 30 in this aspheric embodiment receives off-axis light. Light concentrator 32 directs the incident polychromatic light towards spectral separator 40. Advantageously, input face 58 acts as a reflective surface for light within photovoltaic apparatus 30, effectively folding the optical path by redirecting light that has sufficient angle for Total Internal Reflection (TIR) within the dielectric optical medium. The perspective view of FIG. 11 shows this TIR effect as viewed from the side of input face 58.

Figure 11:
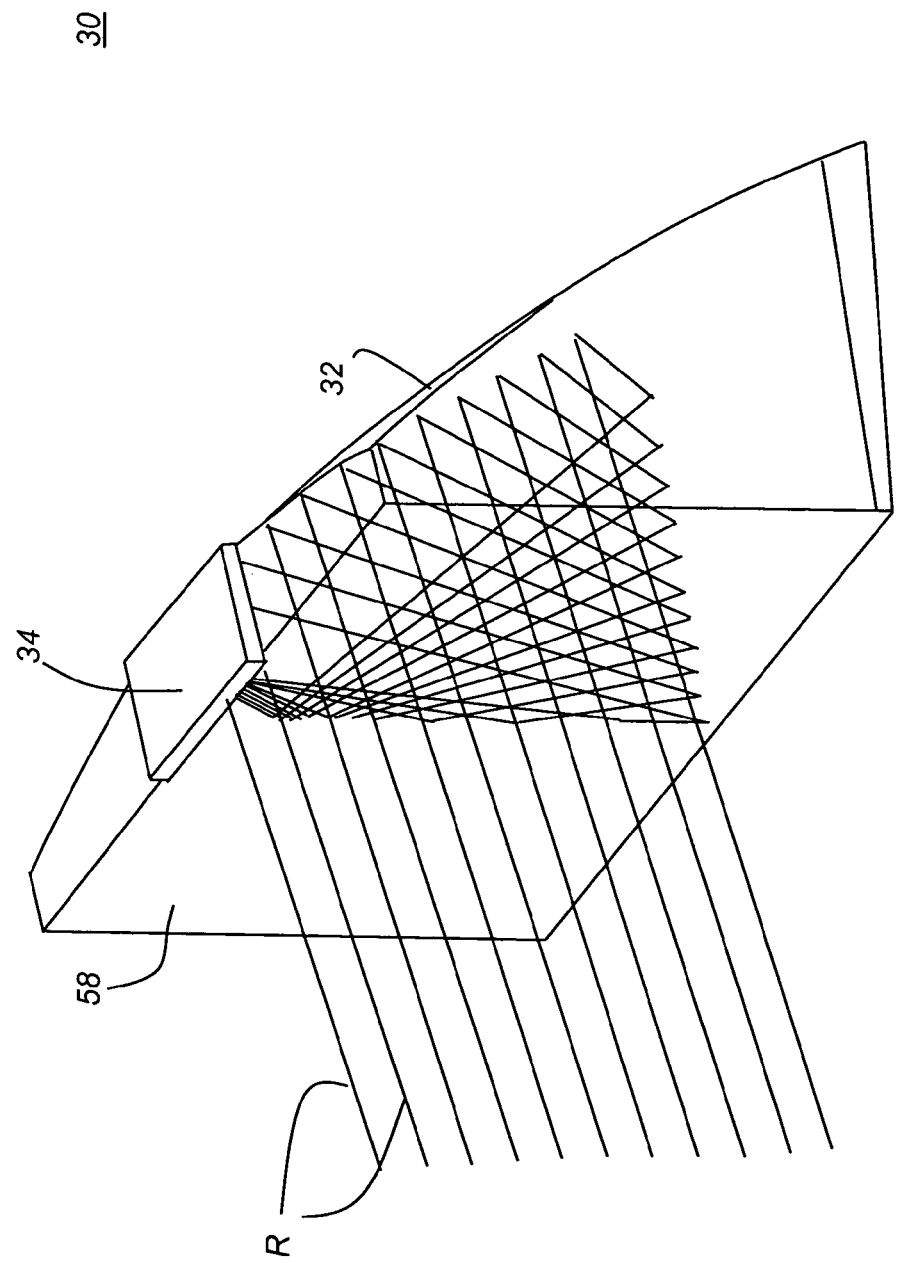
FIG. 11 is a perspective view of the embodiments shown in FIGS. 10A, 10B, and 10C.

With the embodiments shown in FIGS. 10A through 11, the axis of symmetry $A_s$ in the cross-sectional plane of the page does not intersect the surface of light concentrator 32. Axis of symmetry $A_s$ does not constitute the optical axis of interest with this arrangement; instead, the optical axis O is simply defined with respect to the input aperture of light concentrator 32 as was noted earlier.

One difficulty with the arrangement of FIGS. 10A through 11 relates to some small portion of trapped light that can be wasted. Because dichroic reflection is imperfect, there can be some light leakage of lower wavelength light that is inadvertently transmitted through dichroic surface 44. Some of this light can be effectively trapped between dichroic surface 44 and reflective surface 46.

Figure 12:
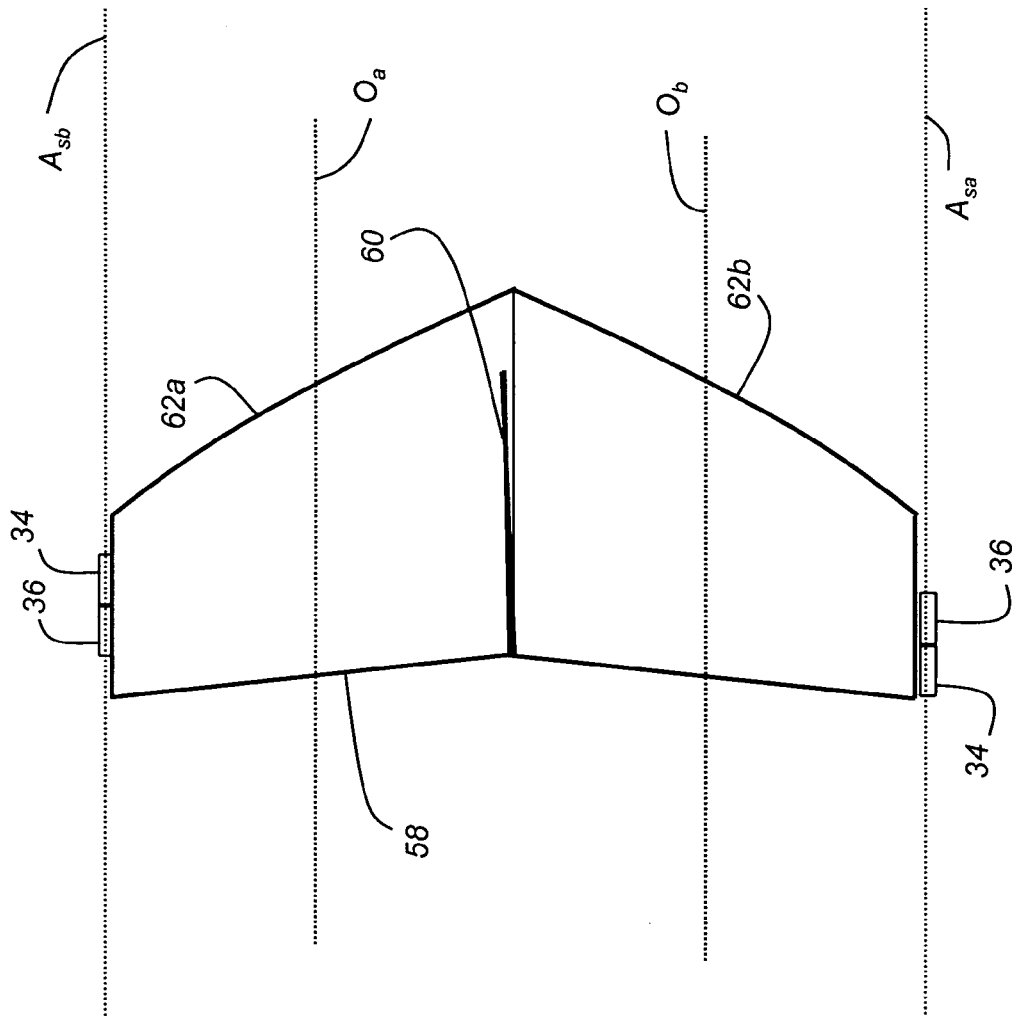
FIG. 12 is a schematic diagram showing the components of another embodiment of the present invention, with combined off-axis reflective aspheric light collectors.

The embodiment shown in FIGS. 12, 13, 14, and 15 unfolds the arrangement of FIGS. 10A through 11 and, by doing so, addresses the problem of trapped light to reduce this effect. Referring first to FIG. 12, there is shown the basic structure of a photovoltaic apparatus 30 formed by combining two similar structures used in the embodiment of FIGS. 10A through 11. For this embodiment, photovoltaic apparatus 30 has two reflective light concentrator surfaces 62a and 62b, with a dichroic surface 60 interposed between them, at an oblique angle. Each reflective light concentrator surface 62a and 62b has its own axis of rotational symmetry $A_{sa}$ or $A_{sb}$ and its own optical axis $O_a$ or $O_b$, respectively. The respective axes of rotational symmetry $A_{sa}$ and $A_{sb}$ do not intersect their corresponding physical surfaces in this embodiment and are not co-linear. In the cross-sectional plane of FIG. 12, the optical axis $O_a$ and $O_b$ of each light concentrator surface 62a or 62b is defined by the path of the ray that strikes the center of the concentrator surface and is generally parallel with the axis of rotational symmetry. Dichroic surface 60 lies between the two concentrating surfaces and is positioned so that the surface is nonparallel with respect to at least one axis of rotational symmetry.

Figure 13:
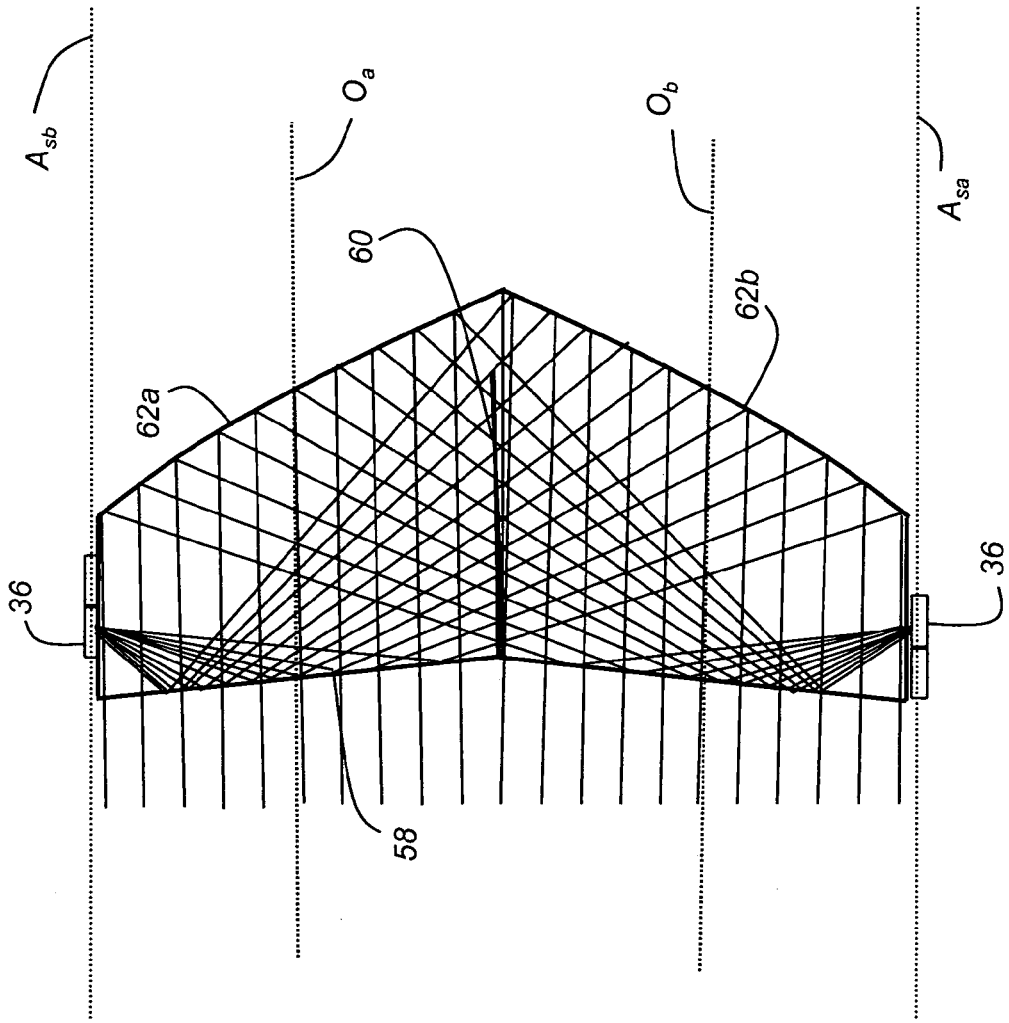
FIG. 13 is a schematic diagram showing handling of low-energy light using combined off-axis reflective parabolas.

FIG. 13 shows the path of low-energy light within photovoltaic apparatus 30 of this aspheric embodiment. Because it transmits light outside the high-energy spectral band, dichroic surface 60 is effectively "transparent" to the low-energy light path. Notably, light rays incident on light concentrator surface 62a transmit through dichroic surface 60 and are directed, along an optical path that folds due to TIR at input face 58, to light receivers 36 on the opposite side of the apparatus. Note that input face 58 may or may not need to be at an oblique angle with respect to the optical axes $O_a$ and $O_b$ as shown in order to enable total internal reflection to take place.

Figure 14:
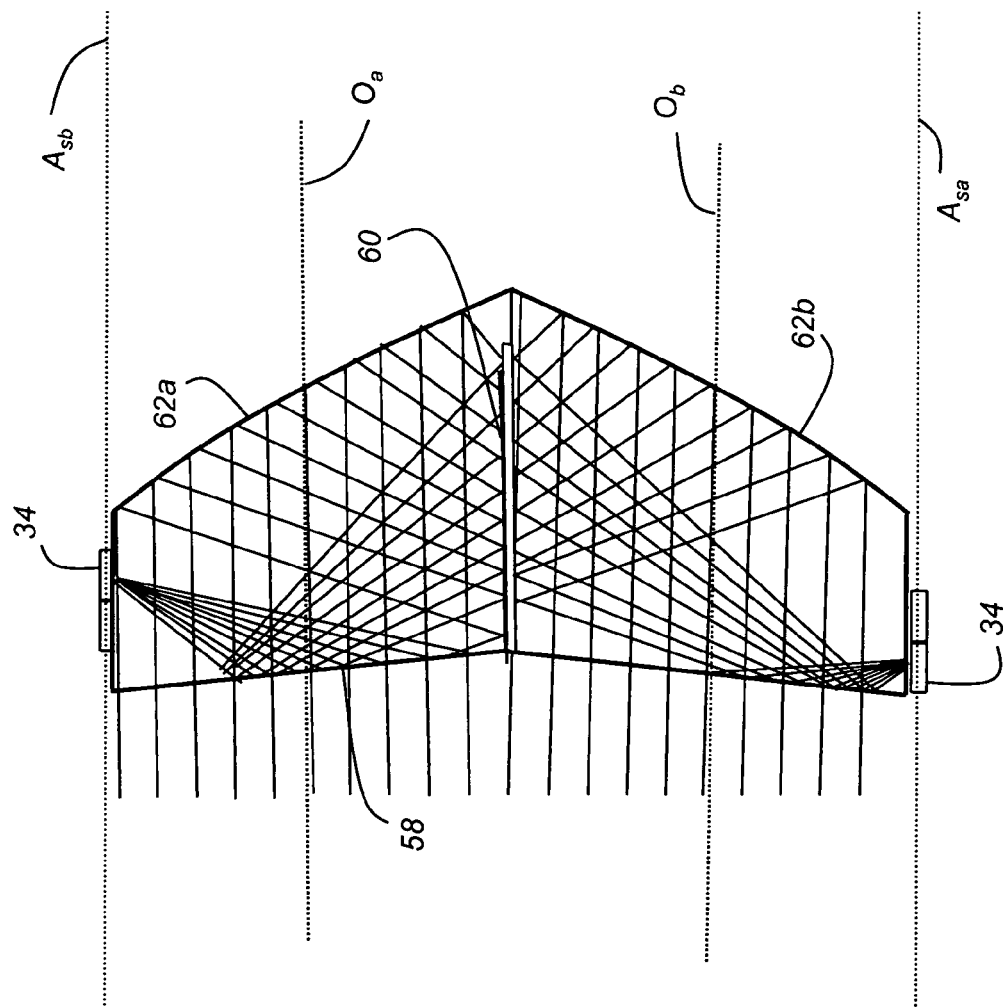
FIG. 14 is a schematic diagram showing handling of high-energy light using combined off-axis reflective-parabolas.
Figure 15:
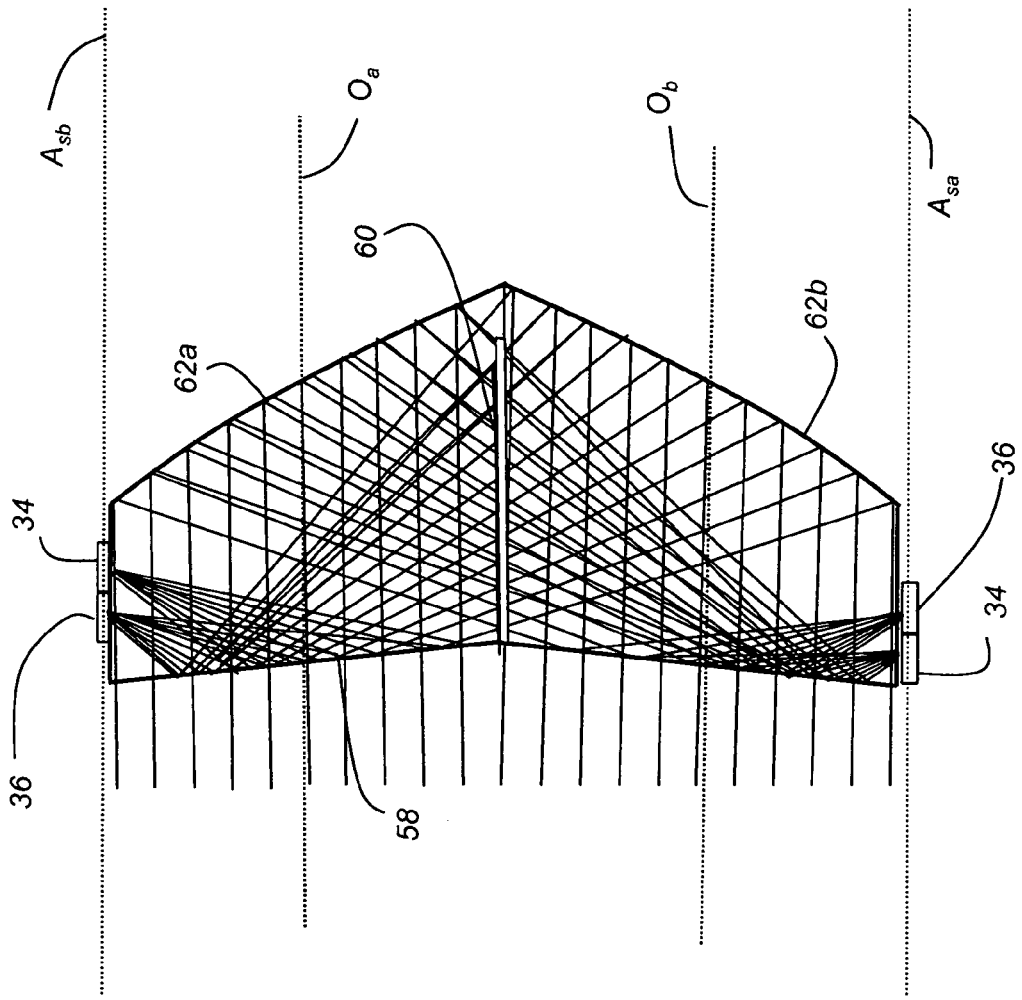
FIG. 15 is a schematic diagram showing combined handling of both low- and high-energy light using combined off-axis reflective parabolas.

FIG. 14 shows the path of high-energy light within photovoltaic apparatus 30. For this light, dichroic surface 60 serves as a reflector, folding the light path accordingly. TIR on input face 58 similarly provides another reflective fold in the light path, directing the light to receiver 34 on the same side of the apparatus as the corresponding input polychromatic light. FIG. 15 shows combined light paths for both low- and high-energy light with this embodiment.

The embodiment shown in FIGS. 12-15 reduces the problem of trapped light, noted with respect to embodiments in FIGS. 10A and 10B. Referring again to FIG. 15, some of the higher energy light that leaks through dichroic surface 60 and is not reflected is directed to light receivers 34, 36 on the opposite side of photovoltaic apparatus 30. The embodiment of photovoltaic receiver 30 that is shown in FIGS. 12-15 can be a cylindrical design, formed on a suitable dielectric material, as has been noted for other embodiments.

Still referring to FIGS. 12-15, light concentrator surfaces 62a and 62b can be coated with a reflective coating, typically formed by applying a reflective metal coating or a dichroic coating. In an alternate embodiment, light concentrator surfaces 62a and 62b may reflect and redirect incident polychromatic light using total internal reflection (TIR). This would require forming photovoltaic apparatus 30 from a dielectric material having a high refractive index n and arranging light concentrator surfaces 62a and 62b to have a suitable shape and angular inclination for TIR. In another alternate embodiment, photovoltaic apparatus 30 can provide adjacent light concentrator surfaces 62a and 62b without spectral separation from dichroic surface 60. Here, the light receiver for light concentrator surface 62a is positioned nearest light concentrator surface 62b and the light receiver for light concentrator surface 62b is positioned nearest light concentrator surface 62a. In this arrangement, light receivers at top and bottom edges of photovoltaic apparatus 30 could be multifunction photovoltaic cells or other photovoltaic cell types. This alternate embodiment would also provide the enhanced field of view that is afforded by using TIR from input face 58.

Figure 16:
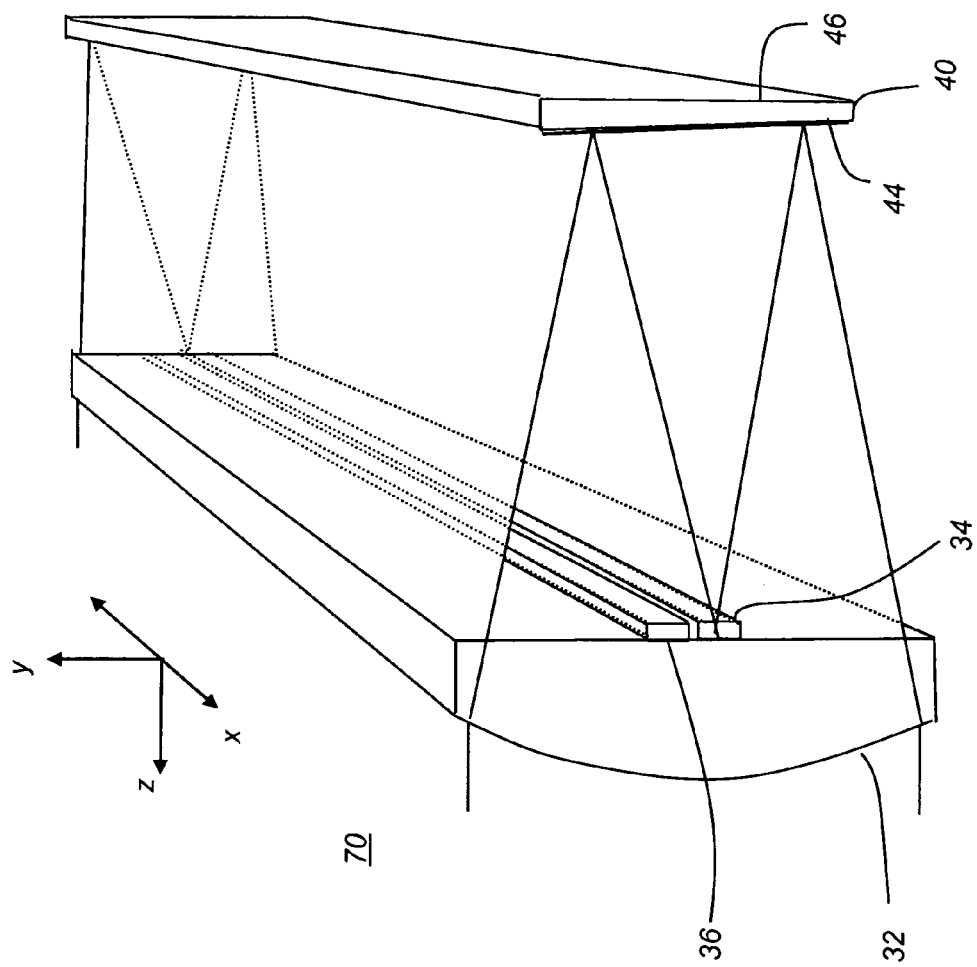
FIG. 16 is a perspective view showing a cylindrical embodiment of the photovoltaic apparatus of the present invention.
Figure 17:
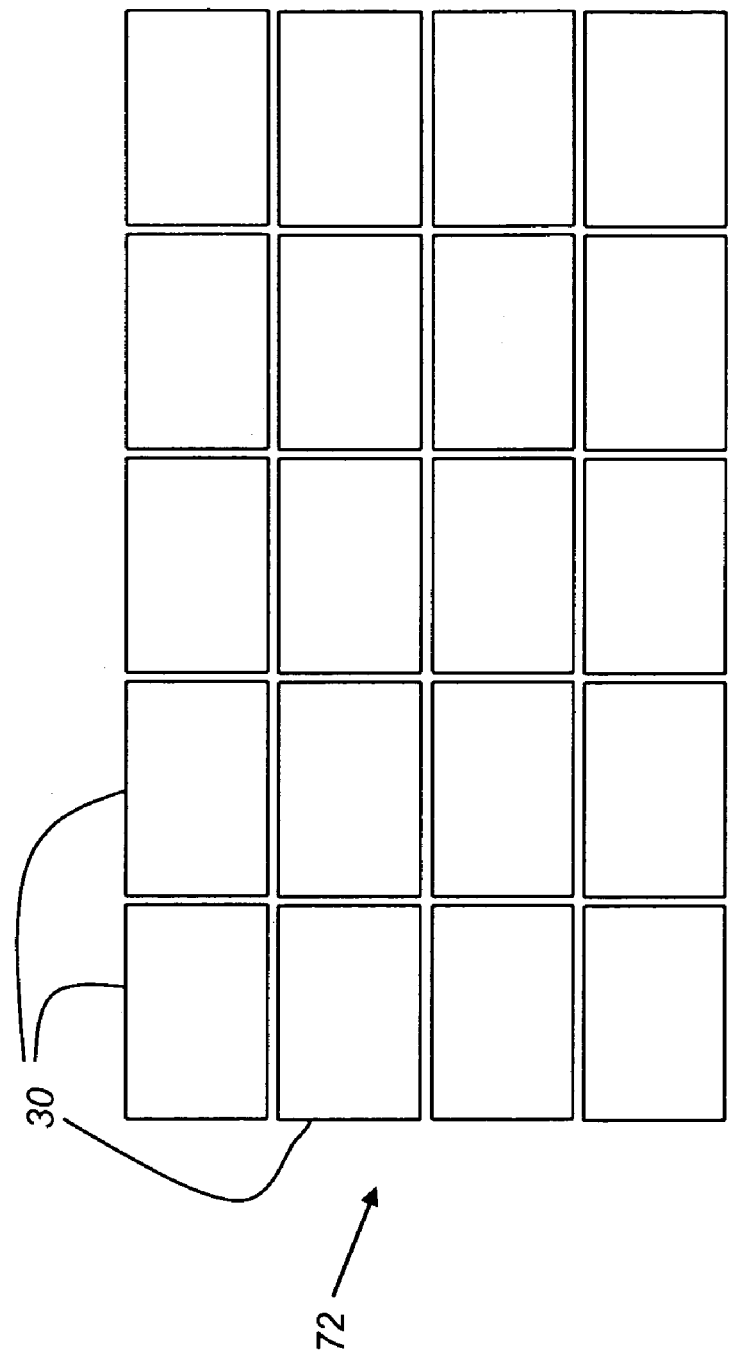
FIG. 17 is a plan view showing an array of photovoltaic apparatus in one embodiment.
Figure 18:
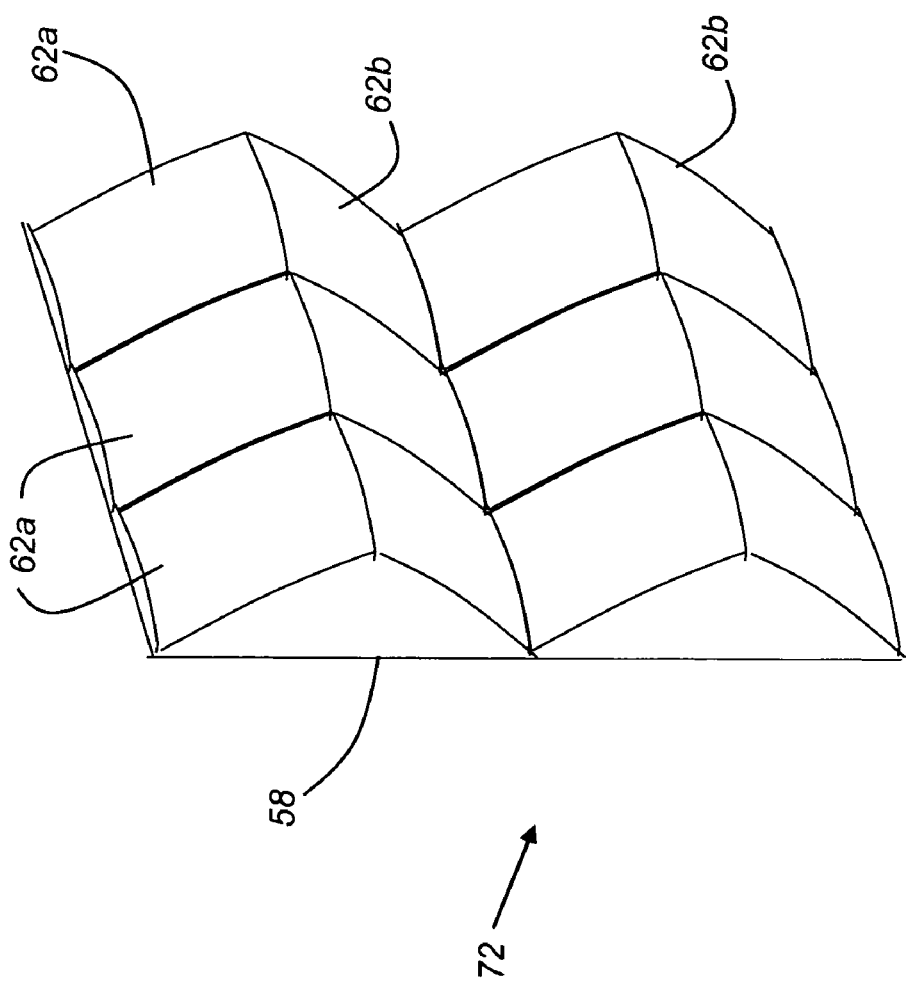
FIG. 18 is a perspective view showing an array of photovoltaic devices formed from combined off-axis reflective parabolas.

The method and apparatus of the present invention can be used to provide photovoltaic devices in cylindrical form and array form. Embodiments of the photovoltaic device of the present invention can be fabricated as discrete devices or fabricated for use in an array. The perspective view of FIG. 16 shows a cylindrical photovoltaic apparatus 70, based on the model shown in FIGS. 2A and 2B. Here, photovoltaic apparatus 70 is extended in the x direction, using the coordinate mapping that is shown. An array can be formed by suitable stacking of two or more of such extended photovoltaic apparatus 70. FIG. 17 shows an alternate array 72 arrangement using a matrix of photovoltaic apparatus 30 arranged in rows and columns. FIG. 18 shows array 72 that consists of photovoltaic devices formed from combined off-axis reflective parabolas, such as those shown in FIGS. 12-15, for example. As can be appreciated by those skilled in the optical design arts, the refractive index n of any dielectric material that is used must be taken into account in order to optimize response and efficiency of these array devices.

Orientation With Respect to the Radiation Source

Figure 19:
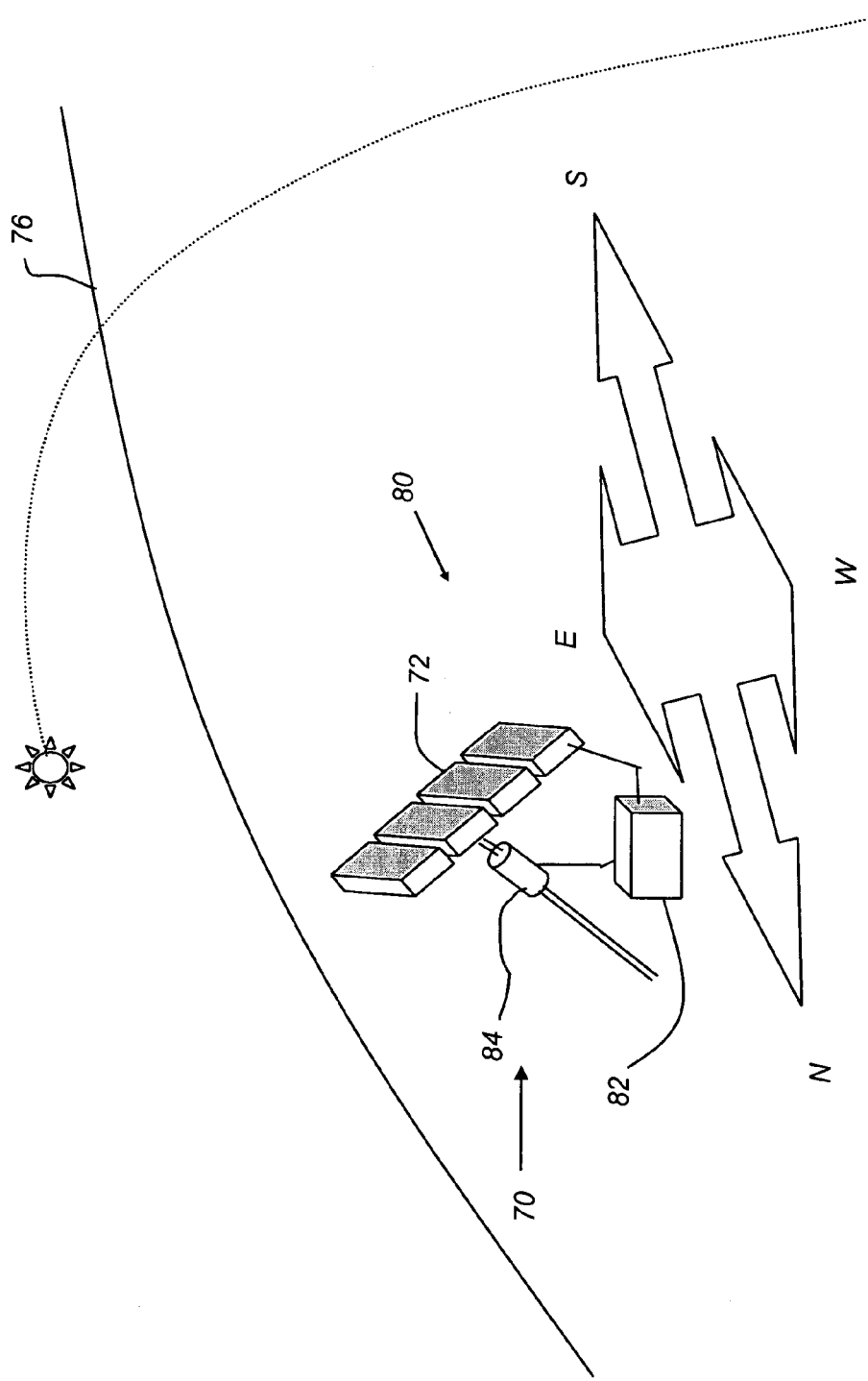
FIG. 19 is a schematic diagram in perspective, showing a solar energy apparatus with tracking to adapt to the changing position of the radiation source.

Solar tracking systems and methods are well known and can be readily adapted to use light concentrator 30, either in discrete or in array form. FIG. 19 shows a solar energy system 80 according to the present invention. One or more radiant energy concentration apparatus, such as array 72, is arranged and designed to track the sun. A tracking actuator 84 is controlled by a control logic processor 82 to properly orient photovoltaic apparatus 70 as the sun's E-W position changes relative to earth 76 throughout the day as well as to make minor adjustments necessary for proper N-S orientation. Control logic processor 82 may be a computer or a dedicated microprocessor-based control apparatus, for example. Control logic processor 82 may sense position by measuring the relative amount of electrical current obtained at a position, or by obtaining some other suitable signal. In response to this signal that is indicative of position, control logic processor 82 then provides a control signal to instruct tracking actuator 84 to make positional adjustments accordingly.

The apparatus of the present invention enables use of photovoltaic receivers having a lateral, rather than requiring a multifunction or stacked, arrangement. In the lateral arrangement, separate spectral bands are directed onto suitable photovoltaic cells, each optimized for obtaining light energy from the wavelengths in that spectral band. The apparatus of the present invention can be used to provide a discrete, modular light-concentrating element or an array of light concentrators. The apparatus is scalable and can be adapted to thin panel applications or to larger scale radiant energy apparatus. One or more of light receivers 34 and 36 can be photovoltaic (PV) devices, fabricated from any suitable photovoltaic materials for the spectral bands provided, including silicon, gallium arsenide (GaAs), gallium antimonide (GaSb), and other materials. One or more of light receivers 34 or 36 could be a multijunction photovoltaic receiver. One or more of light receivers 34 and 36 could alternately be thermovoltaic or thermophotovoltaic (TPV), using some material that converts heat into electricity, including thermoelectric material such as mercury cadmium telluride thermal diodes. One or more of light receivers 34 and 36 could be a charge-coupled device (CCD) or other light sensor.

The apparatus of the present invention has been described chiefly as a photovoltaic apparatus in the preceding description. However, in its broadest application, the apparatus of the present invention serves as a collector of radiant energy that provides spectral separation of this energy into spectral bands and redirects each spectral band toward a light receiver of some type. In alternate embodiments, one or more of light receivers 34, 36 is the input image plane of another optical subsystem, such as for energy generation or spectral analysis, for example. Light receiver 34, 36 can alternately be an input to a light guide such as an optical fiber, for example.

It can be observed that the two or more spectral bands provided to light receivers 34 and 36 are not sharply spectrally distinct, but will have some overlap, where each spectral band contains some of the same wavelengths. Some amount of spectral contamination would be inevitable, since dichroic response is imperfect and light can be incident at non-normal angles, degrading the performance of the dichroic coating. Dichroic coatings could be optimized in order to reduce spectral contamination to lower levels where desired. As was noted earlier, a dichroic coating could alternately be provided for reflective surface 46 of spectral separator 40, instead of a reflective coating of some other type, thus providing improved efficiency over many types of conventional mirror coatings. For any of the embodiments shown hereinabove, spectral bands can be defined and optimized as best suits the requirements of an application.

Thus, what is provided is an apparatus that collects light from the sun or other polychromatic radiation source, separates light into two or more spectral bands, and provides each spectral band to a light receiver.

PARTS LIST

10. Photovoltaic apparatus
12. Primary mirror
14. Secondary mirror
16, 18. Receiver
20. Beamsplitter
22. Lens
30. Photovoltaic apparatus
32. Light concentrator
34, 36. Receiver
40. Spectral separator
44. Dichroic surface
46. Reflective surface
48. Mirror
50. Light concentration and spectral separation element
52, 54. Reflective surface
56. Reflective surface
58. Input face
60. Dichroic surface
62a, 62b. Light concentrator surface
64. Dichroic surface
70. Photovoltaic apparatus
72. Array
76. Earth
80. Solar energy system
82. Control logic processor
84. Actuator
$\alpha, \beta$. Rotation angle
$O, O_a, O_b$. Optical axis
R. Ray
$A_s, A_{sa}, A_{sb}$. Axis of rotational symmetry

We claim:

1. An apparatus for obtaining energy from a polychromatic radiant energy source, the apparatus comprising:
   a) a light concentrator for concentrating and redirecting incident radiant energy, the light concentrator having an optical axis;
   b) a spectral separator spaced apart from the light concentrator and disposed along the optical axis and in the path of concentrated, redirected radiant energy, the spectral separator comprising:
      (i) a first planar surface treated to reflect a first spectral band of light received from the light concentrator toward a first focal region of the light concentrator and to transmit a second spectral band;
      (ii) a second planar surface spaced apart from the first planar surface and oblique with respect to the first planar surface, wherein the second planar surface is treated to reflect the second spectral band back through the first planar surface and toward a second focal region of the light concentrator that is spaced apart from the first focal region;
   and
   c) first and second light receivers,
   wherein the first light receiver is disposed nearest the first focal region for receiving the first spectral band and the second light receiver is disposed nearest the second focal region for receiving the second spectral band.

2. The apparatus according to claim 1 wherein the first planar surface reflects visible wavelengths.

3. The apparatus according to claim 1 wherein the first planar surface reflects infrared wavelengths.

4. The apparatus according to claim 1 wherein the first planar surface has a dichroic coating.

5. The apparatus according to claim 1 wherein the second planar surface has a dichroic coating.

6. The apparatus according to claim 1 wherein at least one of the first and second light receivers is a photovoltaic receiver.

7. The apparatus according to claim 1 wherein at least one of the first and second light receivers is a thermovoltaic receiver.

8. The apparatus according to claim 1 wherein at least one of the first and second light receivers comprises an optical fiber.

9. The apparatus according to claim 1 wherein at least one of the first and second light receivers is an input plane for another optical system.

10. The apparatus according to claim 1 wherein at least one of the first and second light receivers comprises a multijunction photovoltaic cell.

11. The apparatus according to claim 1 wherein a solid dielectric material lies between the first and second planar surfaces.

12. The apparatus according to claim 1 wherein the light concentrator is reflective.

13. The apparatus according to claim 1 wherein the light concentrator is refractive.

14. The apparatus according to claim 1 wherein the optical axis of said light concentrator lies between the first and second focal regions.

15. The apparatus according to claim 1 wherein a solid dielectric material lies between the light concentrator and the spectral separator.

16. The apparatus according to claim 1 wherein at least one of the first and second receivers obscures a portion of the aperture of the light concentrator.

17. The apparatus according to claim 1 wherein neither the first nor the second receiver obscures a portion of the aperture of the light concentrator.

18. The apparatus according to claim 1 wherein the spectral separator further comprises a solid dielectric material between the first and second planar surfaces and wherein the first and second light receivers lie substantially in the same plane.

19. The apparatus according to claim 12 wherein the light concentrator is substantially parabolic in cross-section.

20. The apparatus according to claim 1 wherein at least one of the first and second planar surfaces is oblique with respect to the optical axis of the light concentrator.

21. The apparatus according to claim 11 wherein the solid dielectric material is taken from the group consisting of glass and plastic.

22. An apparatus for obtaining radiant energy from a polychromatic radiant energy source, the apparatus comprising:
   a) a first reflective light concentrator for concentrating and redirecting incident polychromatic light, wherein the first reflective light concentrator has a first axis of symmetry and a first optical axis;
   b) a second reflective light concentrator for concentrating and redirecting incident polychromatic light, wherein the second reflective light concentrator has a second axis of symmetry and a second optical axis,
   and wherein the second optical axis is non-collinear with the first optical axis and wherein the second axis of symmetry is non-collinear with the first axis of symmetry;
   c) a dichroic surface disposed between said first and second reflective light concentrators and in the path of the redirected polychromatic light from both first and second reflective light concentrators, the dichroic surface reflective to a first spectral band of light received from the light concentrators and transmissive to other light;

wherein said dichroic surface is disposed so that it is not parallel to at least one of said first and second axes of symmetry;

d) a first light receiver disposed to receive light of the first spectral band directed from the first reflective light concentrator and reflected from the dichroic surface;

e) a second light receiver disposed to receive light of the first spectral band directed from the second reflective light concentrator and reflected from the dichroic surface;

f) a third light receiver disposed to receive light outside the first spectral band directed from the second reflective light concentrator and transmitted through the dichroic surface;

and g) a fourth light receiver disposed to receive light outside the first spectral band directed from the first reflective light concentrator and transmitted through the dichroic surface.

23. The apparatus according to claim 22 wherein the first axis of symmetry is parallel to the second axis of symmetry.

24. The apparatus according to claim 22 wherein the first reflective light concentrator is formed on a solid dielectric material having a first input face.

25. The apparatus according to claim 24 wherein light of the first spectral band reflects from the first input face due to total internal reflection.

26. The apparatus according to claim 24 wherein light of the second spectral band reflects from the first input face due to total internal reflection.

27. The apparatus according to claim 24 wherein the second reflective light concentrator is formed on a solid dielectric material having a second input face.

28. The apparatus according to claim 24 wherein the first input face is at an oblique angle relative to the first axis of symmetry.

29. The apparatus according to claim 27 wherein the first input face and second input face are non-parallel.

30. The apparatus according to claim 22 wherein at least one of the first and second reflective light concentrators is substantially parabolic in cross-section.

31. The apparatus according to claim 22 wherein the first reflective light concentrator comprises a reflective coating taken from the group consisting of a dichroic coating and a metallic coating.

32. The apparatus according to claim 22 wherein the first reflective light concentrator is formed to redirect the incident polychromatic light using total internal reflection.

33. An array comprising a plurality of collectors for obtaining radiant energy from a polychromatic radiant energy source, wherein each collector comprises:
  a) a light concentrator for concentrating and redirecting incident radiant energy;
  b) a spectral separator spaced apart from the light concentrator and in the path of concentrated, redirected radiant energy, the spectral separator comprising:
    (i) a first planar surface treated to reflect a first spectral band of light received from the light concentrator toward a first focal region of the light concentrator and to transmit a second spectral band;
    (ii) a second planar surface spaced apart from the first planar surface and oblique with respect to the first planar surface, wherein the second planar surface is treated to reflect the second spectral band back through the first planar surface and toward a second focal region of the light concentrator that is spaced apart from the first focal region;
  and
  c) first and second light receivers,
  wherein the first light receiver is disposed nearest the first focal region of the light concentrator for receiving the first spectral band and the second light receiver is disposed nearest the second focal region of the light concentrator for receiving the second spectral band.

34. An array comprising a plurality of collectors for obtaining radiant energy from a polychromatic radiant energy source, wherein each collector comprises:
  a) a first reflective light concentrator for concentrating and redirecting incident polychromatic radiant energy, wherein the first reflective light concentrator has a first axis of symmetry and a first optical axis;
  b) a second reflective light concentrator for concentrating and redirecting incident polychromatic radiant energy, wherein the second reflective light concentrator has a second axis of symmetry and a second optical axis,
  and wherein the second optical axis is non-collinear with the first optical axis and wherein the second axis of symmetry is non-collinear with the first axis of symmetry;
  c) a dichroic surface disposed between said first and second reflective light concentrators and in the path of the redirected polychromatic light from both first and second reflective light concentrators, the dichroic surface reflective to a first spectral band of light received from the light concentrators and transmissive to other light; wherein said dichroic surface is disposed so that it is not parallel to at least one of said axes of symmetry;
  d) a first light receiver disposed to receive light of the first spectral band directed from the first reflective light concentrator and reflected from the dichroic surface;
  e) a second light receiver disposed to receive light of the first spectral band directed from the second reflective light concentrator and reflected from the dichroic surface;
  f) a third light receiver disposed to receive light outside the first spectral band directed from the second reflective light concentrator and transmitted through the dichroic surface;
  and
  g) a fourth light receiver disposed to receive light outside the first spectral band directed from the first reflective light concentrator and transmitted through the dichroic surface.

35. An apparatus for obtaining radiant energy from a polychromatic radiant energy source, the apparatus comprising:
  a) a first reflective light concentrator for concentrating and redirecting incident polychromatic light, wherein the first reflective light concentrator has a first axis of symmetry and a first optical axis;
  b) a second reflective light concentrator for concentrating and redirecting incident polychromatic light, wherein the second reflective light concentrator has a second axis of symmetry and a second optical axis,
  wherein the first and second light concentrators are adjacent to each other and wherein the second optical axis is non-collinear with the first optical axis and wherein the second axis of symmetry is non-collinear with the first axis of symmetry;
  c) a first light receiver positioned nearest the second light receiver and disposed to receive light redirected from the first reflective light concentrator;
  d) a second light receiver positioned nearest the first light receiver and disposed to receive light redirected from the second reflective light concentrator.

* * * * *